(12) United States Patent
Steinberg et al.

(10) Patent No.: US 6,885,786 B2
(45) Date of Patent: Apr. 26, 2005

(54) COMBINED WET AND DRY ETCHING PROCESS FOR MICROMACHINING OF CRYSTALLINE MATERIALS

(75) Inventors: Dan A. Steinberg, Blacksburg, VA (US); Jasean Rasnake, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 212 days.

(21) Appl. No.: 10/071,261

(22) Filed: Feb. 7, 2002

(65) Prior Publication Data

US 2003/0020130 A1 Jan. 30, 2003

Related U.S. Application Data

(60) Provisional application No. 60/266,931, filed on Feb. 7, 2001.

(51) Int. Cl.[7] .............................. G02B 6/12; H01L 31/00
(52) U.S. Cl. ........................ 385/14; 385/129; 385/88; 385/92; 257/466; 257/622
(58) Field of Search .......................... 385/14, 129, 130, 385/131, 132, 49, 92, 88; 257/466, 622

(56) References Cited

U.S. PATENT DOCUMENTS

| 4,021,097 A | 5/1977 | McMahon |
| 4,181,400 A | 1/1980 | Malsot et al. |
| 4,225,213 A | 9/1980 | McBride, Jr. et al. |
| 4,253,735 A | 3/1981 | Kawamura et al. |
| 4,362,367 A | 12/1982 | Hammer et al. |
| 4,411,057 A | 10/1983 | Duda et al. |
| 4,601,541 A | 7/1986 | Shaw et al. |
| 4,683,560 A | 7/1987 | Takeuchi et al. |
| 4,706,061 A | 11/1987 | Johnson |
| 4,784,721 A | 11/1988 | Holmen et al. |
| 4,810,557 A * | 3/1989 | Blonder .................. 428/156 |
| 4,812,002 A | 3/1989 | Kato et al. |
| 4,830,450 A | 5/1989 | Connell et al. |
| 4,837,129 A | 6/1989 | Frisch et al. |
| 4,863,560 A | 9/1989 | Hawkins .................. 156/644 |
| 4,904,036 A | 2/1990 | Blonder |
| 4,938,841 A | 7/1990 | Shahar et al. |
| 4,945,400 A | 7/1990 | Blonder et al. |
| 4,957,592 A | 9/1990 | O'Neill |
| 5,024,500 A | 6/1991 | Stanley et al. |
| 5,095,386 A | 3/1992 | Scheibengraber |
| 5,135,590 A | 8/1992 | Basavanhally et al. |
| 5,281,301 A | 1/1994 | Basavanhally |
| 5,338,400 A * | 8/1994 | Jerman .................. 216/67 |
| 5,339,377 A | 8/1994 | Takahashi |
| 5,357,593 A | 10/1994 | Bossler |

(Continued)

FOREIGN PATENT DOCUMENTS

WO    03/008139    1/2003

OTHER PUBLICATIONS

A. Jasper Nijdam et al., "Etching of silicon in alkaline solutions: a critical look at the (111) minimum", MESA Research Institute for Micro Electronics Materials, no date.

(Continued)

Primary Examiner—Brian M. Healy
(74) Attorney, Agent, or Firm—Jonathan D. Baskin; Niels Haun

(57) ABSTRACT

A novel micromachining method in which dry etching and anisotropic wet etching are combined.

41 Claims, 25 Drawing Sheets

U.S. PATENT DOCUMENTS

| | | | |
|---|---|---|---|
| 5,381,231 A | 1/1995 | Tu | |
| 5,384,872 A | 1/1995 | Jacobs-Cook et al. | |
| 5,440,657 A | 8/1995 | Essert | |
| 5,478,438 A * | 12/1995 | Nakanishi et al. | 438/702 |
| 5,479,426 A | 12/1995 | Nakanishi et al. | |
| 5,507,911 A | 4/1996 | Greiff | |
| 5,611,006 A | 3/1997 | Tabuchi | 385/14 |
| 5,760,305 A | 6/1998 | Greiff | |
| 5,781,675 A | 7/1998 | Tseng et al. | |
| 5,844,723 A | 12/1998 | Snyder | |
| 5,852,308 A | 12/1998 | Wood | |
| 5,886,249 A | 3/1999 | Bonne et al. | |
| 5,896,481 A | 4/1999 | Beranek et al. | |
| 5,911,021 A | 6/1999 | MacDonald et al. | 385/35 |
| 5,966,493 A | 10/1999 | Wagoner et al. | |
| 6,023,546 A | 2/2000 | Tachigori | |
| 6,088,168 A | 7/2000 | Snyder | |
| 6,132,107 A | 10/2000 | Morikawa | |
| 6,146,917 A | 11/2000 | Zhang et al. | |
| 6,187,515 B1 | 2/2001 | Tran et al. | 430/321 |
| 6,212,320 B1 | 4/2001 | Rickman et al. | |
| 6,257,772 B1 | 7/2001 | Nakanishi et al. | |
| 6,428,053 B1 | 8/2002 | Tai et al. | |
| 6,511,235 B2 | 1/2003 | Guo et al. | |
| 6,548,371 B2 | 4/2003 | Fujimaki | |
| 6,553,173 B1 | 4/2003 | Goto | |
| 6,567,590 B1 * | 5/2003 | Okada et al. | 385/49 |
| 6,627,096 B2 * | 9/2003 | Sherrer et al. | 216/24 |
| 6,811,853 B1 * | 11/2004 | Sherrer et al. | 428/138 |
| 2001/0050266 A1 * | 12/2001 | Sherrer et al. | 216/24 |
| 2002/0195417 A1 | 12/2002 | Steinberg | |
| 2003/0020130 A1 * | 1/2003 | Steinberg et al. | 257/466 |
| 2003/0021572 A1 | 1/2003 | Steinberg | |
| 2003/0034438 A1 | 2/2003 | Sherrer et al. | |
| 2003/0059622 A1 | 3/2003 | Steinberg et al. | |
| 2003/0067049 A1 | 4/2003 | Steinberg et al. | |

OTHER PUBLICATIONS

J. Van Suchtelen et al., "Simulation of Anisotropic Wet–Chemical Etching Using a Physical Model", MESA Research Institute for Micro Electronics Materials Engineering, Sensors, no date.

R. E. Oosterbroek et al., "New design methodologies in <111> oriented silicon wafers", MESA Research Institute for Micro Electronics Materials Engineering, Sensors & Actuators, no date.

Brugger, J., et al., "Self–aligned 3D shadow mask technique for patterning deeply recessed surfaces of micro–electro–mechanical systems devices", Sensors and Actuators 76, pp. 329–334. 1999.

Fleming, J.G., "Combining the best of bulk and surface micromachining using Si{111} substrates", SPIE vol. 3511, pp. 162–168. Sep. 1998.

* cited by examiner

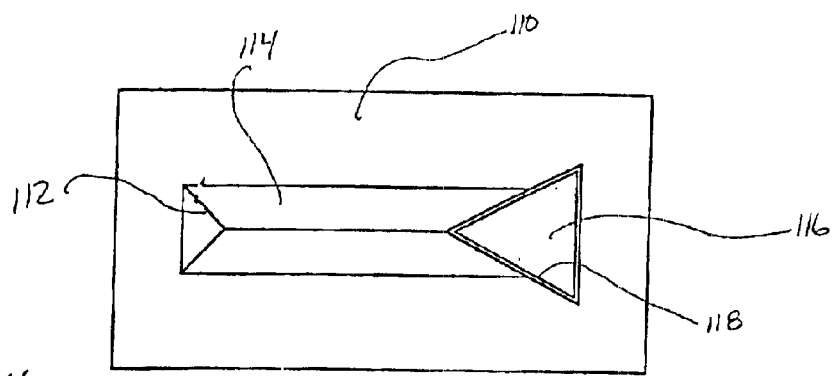
FIGURE 4
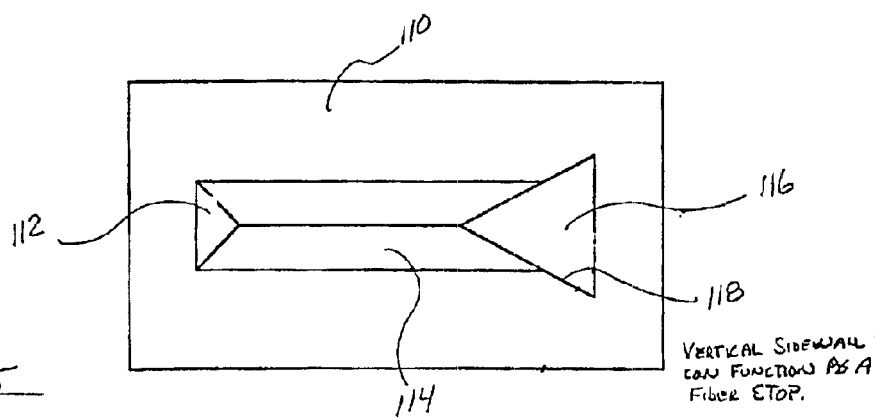
FIGURE 5
VERTICAL SIDEWALL that can FUNCTION AS A Fiber STOP.
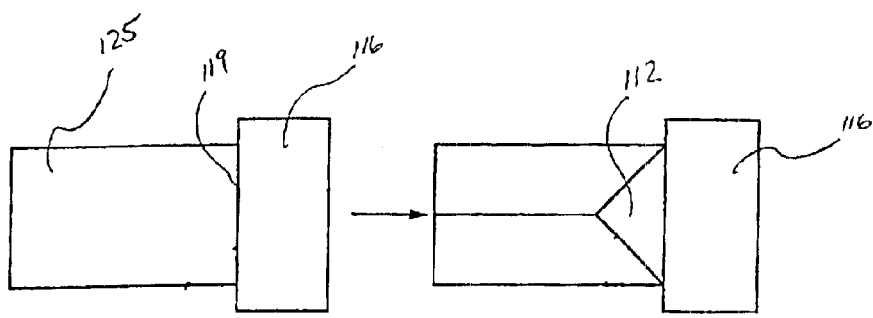
FIGURE 6
FIGURE 7

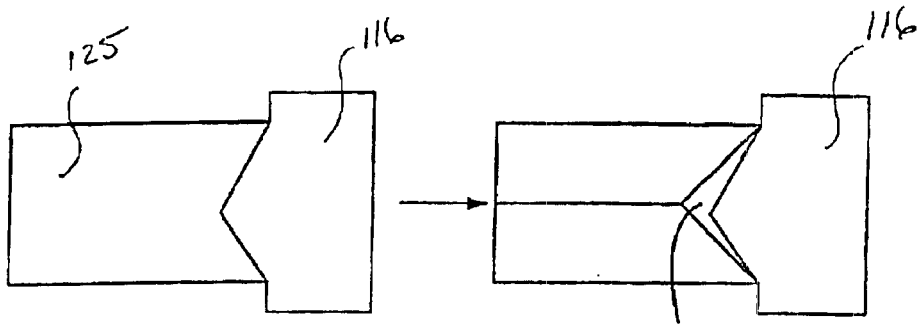
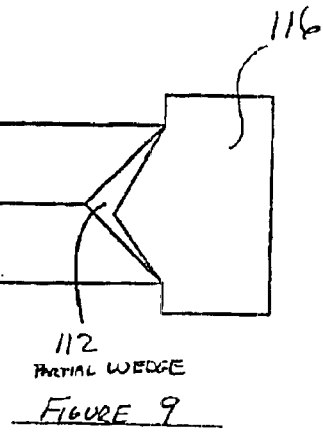
FIGURE 8   FIGURE 9
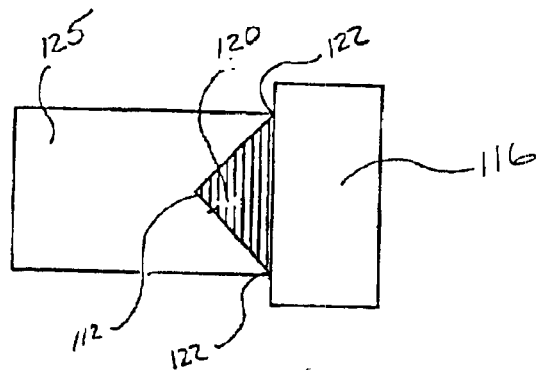
FIGURE 10
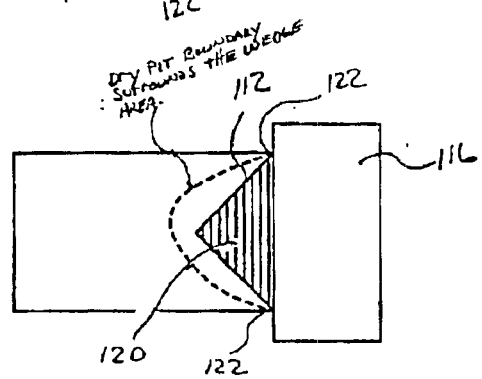
FIGURE 11
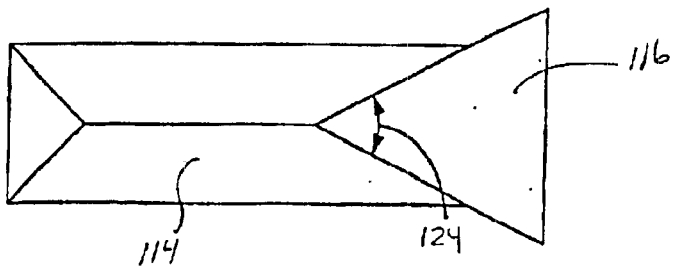
FIGURE 12

FORM 4 DRY PITS AT LOCATIONS OF CONVEX CORNERS

FORM A U-SHAPED DRY PIT

CROSS-SECTIONAL VIEW SHOWN IN FIGURE 52

COMBINED WET AND DRY ETCHING PROCESS FOR MICROMACHINING OF CRYSTALLINE MATERIALS

RELATED APPLICATIONS

The present application claims the benefit of priority from copending provisional patent application 60/266,931 filed on Feb. 7, 2001 and which is hereby incorporated by reference.

FIELD OF THE INVENTION

The present invention relates generally to micromachining. More particularly, the present invention relates to a new method for combining directional ion etching and anisotropic wet etching. The present invention is particularly applicable to silicon micromachining.

BACKGROUND OF THE INVENTION

Silicon optical bench chips often have anisotropically etched V-grooves for holding optical fibers or other components. Also, SiOB chips can have dicing saw cuts that function as fiber stops, thereby providing passive longitudinal alignment for an optical fiber. Such optical bench chips are well known in the art. In some cases, it is not desirable or practical to have dicing saw cuts. Particularly, [dicing saw] cuts can be undesirable because they typically must extend across an entire wafer.

It would be an advance in the art to provide fiber stops in optical bench chips without requiring dicing saw cuts. Also, it would be an advance in the art of micromachining to provide a wider array of precision made structures. Particularly, it would be an advance to combine multiple micromachining techniques to provide unusual, useful structures.

SUMMARY OF THE INVENTION

The above discussed advance is addressed by an optical submount comprising: a) a crystalline substrate; b) an anisotropically etched groove in the substrate; and c) a dry pit intersecting the groove at one end of the groove, wherein the dry pit intersects a wedge area of the groove.

A micromachined crystalline substrate comprising: a) an anisotropically etched groove in the substrate; and b) a dry pit intersecting the groove at one end of the groove, wherein the dry pit intersects a wedge area of the groove.

A micromachined crystalline substrate comprising: a) a first anisotropically etched groove in the substrate; b) a second anisotropically etched groove in the substrate, parallel with the first groove; and c) a dry pit disposed between the first groove and second groove, wherein the dry pit intersects a wedge area of the first groove, and intersects a wedge area of the second groove.

A micromachined crystalline substrate comprising: a) an anisotropically etched groove in the substrate; and b) a dry pit intersecting the groove at one end of the groove, wherein the dry pit intersects the groove at an angles of 45 degree or less, so that a wedge is not present in the groove adjacent to the dry pit.

A micromachined crystalline substrate comprising: a) a first anisotropically etched groove in the substrate; b) a second anisotropically etched groove in the substrate, perpendicular with the first groove and joined with the first groove; and c) a dry pit disposed at a convex corner location where the first and second grooves meet.

A micromachined crystalline substrate comprising: a) an anisotropically etched wet pit in the substrate; b) a U-shaped dry pit intersecting the wet pit; and c) a U-area inside the U-shaped dry pit, wherein the U-shaped dry pit is disposed so that the U-area is not part of the wet pit.

A method for micromachining crystalline substrate comprising the steps of: a) forming a dry pit; b) coating the dry pit with a hard mask material resistant to a anisotropic wet etchant for silicon; and c) anisotropically wet etching an area adjacent to the dry pit.

A method for micromachining <100> silicon comprising the steps of: a) defining three areas of a substrate: an unetched area, a dry etch area, and a wet etch area, wherein the dry etch area and the wet etch area are adjacent; b) forming an SiO2 layer over the unetched and wet etch areas of a substrate, forming silicon nitride on the SiO2 in the wet etch area wherein the dry etch area is uncovered, c) dry etching the dry etch area to form a dry pit: d) oxidizing the substrate to form a SiO2 layer in the dry pit: e) removing the silicon nitride and thinning the SiO2 to expose the wet etch area; and f) wet etching the wet etch area.

A method for micromachinine<100>silicon comprising the steps of: a) defining three areas of a substrate: an unetched area, a dry etch area, and a wet etch area, wherein the dry etch area and the wet etch area are adjacent: b) forming a silicon nitride+SiO2 layer over the unetched area, with the SiO2 on top, forming an SiO2 layer over the wet etch area, wherein the dry etch area is uncovered; c) dry etching the dry etch area to form a dry pit; d) conformally coating the substrate with a hard mask material to form a hard mask to form a hard mask layer in the dry pit; e) removing the SiO2 from the substrate so that the wet etch area is exposed; and f) wet etching the wet etch area.

A method for micromachining <100> silicon comprising the steps of: a) defining, three areas of a substrate; an unetched area, a dry etch area, and a wet etch area, wherein the dry etch area and the wet etch area are adjacent; b) forming a photoresist layer over the unetched area, forming a hard mask layer over the wet etch area, wherein the dry etch area is uncovered; c) dry etching the dry etch area to form a dry pit; d) removing the photoresist: e) oxidizing the substrate to form a SiO2 layer in the dry pit; f) removing the hard mask to expose the wet etch area; and f, wet etching the wet etch area.

BRIEF DESCRIPTION OF THE DRAWINGS

Referring to the exemplary drawings wherein like elements are numbered alike in the several Figures:

FIG. 4 is a top view of a substrate with a dry pit, a V-groove and a wedge;

FIG. 5 is a top view of a substrate with a dry pit, a V-groove and a wedge;

FIG. 6 is a top view of a substrate with a straight boundary;

FIG. 7 is a top view of a substrate with a wedge;

FIG. 8 is a top view of a substrate with a dry pit;

FIG. 9 is a top view of a substrate with a partial wedge;

FIG. 10 is a top view of a substrate with a wedge area;

FIG. 11 is a top view of a substrate with a dry pit boundary;

FIG. 12 is a top view of a substrate with a dry pit;

FIG. 62 is a cross-sectional view of a substrate according to a first method;
FIG. 63 is a cross-sectional view of a substrate according to a first method;
FIG. 64 is a cross-sectional view of a substrate according to a second method;
FIG. 65 is a cross-sectional view of a substrate according to a second method.

DETAILED DESCRIPTION

The present invention provides a method for making novel micromachined structures by a combination of dry and wet etching. In the present method, a pit is formed by dry etching (a dry pit), the dry pit is coated with a hard mask material, and then an area adjacent to the dry pit is etched with an anisotropic wet etchant. Preferably, the method is performed in <100> silicon. The hard mask material can be silicon oxide or silicon nitride, for example. The pit formed by anisotropic wet etching can be a Groove, for example. There are several variations on the present method included in the present invention.

The present invention can be used to make a wide range of novel micromachined structures:

1) Grooves that do not have a 'wedge' at an end of the groove.
2) Optical submounts that do not require a dicing saw cut for a fiber cut.
3) Micromachined structures that have protected convex corners, without requiring well known 'corner compensation'.

4) Optical submounts that can locate a laster or detector very close to a ball lens, without requiring the laser to over hang the lens pit.

5) Grooves disposed below a top surface of a substrate.

In the present invention, a pit is first made by dry anisotropic etching. Then, the surfaces (sidewall and bottom) of the pit are masked (e.g. with CVD silicon nitride, CVD SiO2, or thermal oxide). The mask is resistant to an anisotropic etch (e.g. KOH, EDP). Then, the surface of the substrate is anisotropically wet etched. Finally, the mask material in the dry pit is removed. The mask removal step is optional. The method of the present invention can be used to make a very wide variety of micromachined structures such as optical submounts, sensors, and the like.

Figure 1:
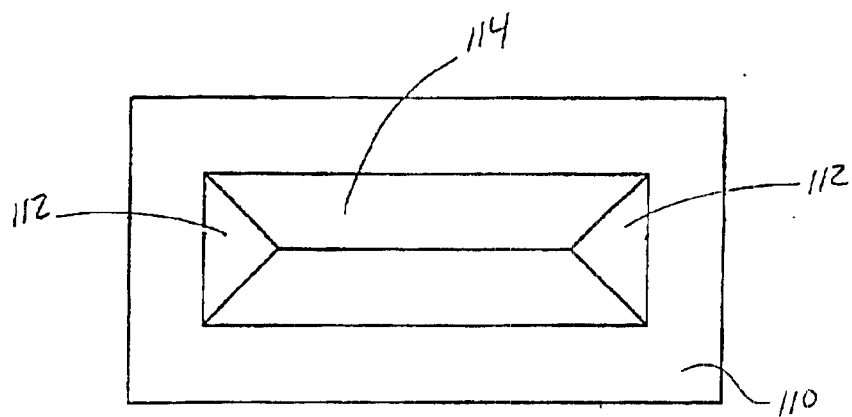
FIG. 1 is a top view of a substrate with a wedge.

Referring to FIG. 1, a substrate 110 is shown and includes a wedge 112 and an anisotropically etched V-groove 114. The present invention is particularly useful for its ability to eliminate the 'wedge' 112 that forms at the end of anisotropically etched V-groove 114. Such a wedge 112 is shown in FIG. 1. Wedges 112 are often undesirable in optical subassemblies because they can block the optical path of light from a fiber disposed in the V-groove 114. Also, wedges 112 function poorly as optical fiber stops, since they are sloped.

Figure 2:
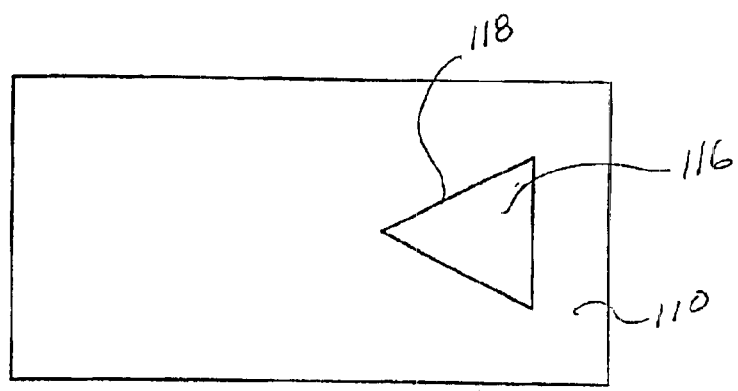
FIG. 2 is a top view of a substrate with a dry pit.
Figure 3:
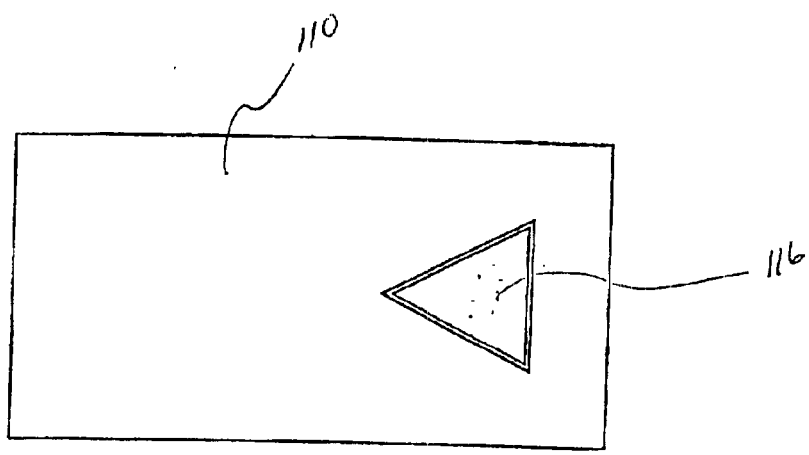
FIG. 3 is a top view of a substrate with a dry pit.

An embodiment of the present invention is illustrated as follows. Referring to FIG. 2, a pit 116 is dry etched into silicon substrate 110. The dry etched pit (dry pit) 116 is optionally made by high-aspect ratio dry etching. The dry pit 116 may have vertical or sloped sidewalls 118. Referring to FIG. 3, the dry pit 116 is coated with a mask material that is resistant to anisotropic wet etchants (e.g. KOH, EDP). The mask material can be CVD silicon nitride, CVD SiO2, or thermal oxide, for example. The top surface can also be coated, but this is optional.

Referring to FIG. 4, the top surface is wet etched to form a wet etched pit (a wet pit) or a V-groove 114. The dry pit 116 removed the material that would have formed the wedge 112 in the V-groove 114. At this point, there may be a free-standing thin film from the sidewall 118 of the dry pit 116 that was exposed during the wet etch. The free-standing thin film is seen edge-on in this top view (FIG. 4). The dry pit 116 should be deep enough so that it is not undercut by the wet etching. Referring to FIG. 5, the dry pit mask material (including the freestanding thin film) are removed. The V-groove 114 does not have a wedge 112 at the end with the dry pit 116. Dry pit 116 may function as a fiber stop, since the sidewalls 118 of the dry pit 116 can be vertical. A distinct advantage of the dry pit fiber stop is that a dicing saw cut is not necessary. In many prior art subassemblies, a dicing saw cut is made across the substrate 110, and the sidewall 118 of the dicing saw cut functions as a fiber stop. Dicing saw cuts have the disadvantages that 1) they typically must extend across the entire wafer, 2) they are rough and produce particle contaminants, 3) they provide only a limited number of shapes for a fiber stop and 4) they create an opening that must be sealed in hermatic packages where the substrate 110 is part of the package.

In the present invention, the dry pit 116 preferably is shaped to remove the wedge 112. Particularly, the dry pit 116 should circumscribe the area of the wedge 112. Referring to FIG. 6, FIG. 7, FIG. 8 and FIG. 9, a dry pit 116 with a straight boundary 119 adjacent to the Wet etched area 125 will produce a wedge 112. Referring to FIG. 10, in order to completely remove the wedge 112, the wedge area 120 must be completely circumscribed by the dry pit 116. The wedge 112 is defined by the points-of-contact 122 between the wet etched area 125 and the dry pit 116. The points-of-contact 122 are shown in FIG. 10. In a top-view, wedges 112 are always 90-45-45 triangles. The points-of-contact 122 are always located at the 45-degree vertices (as viewed in a top view).

Figure 13:
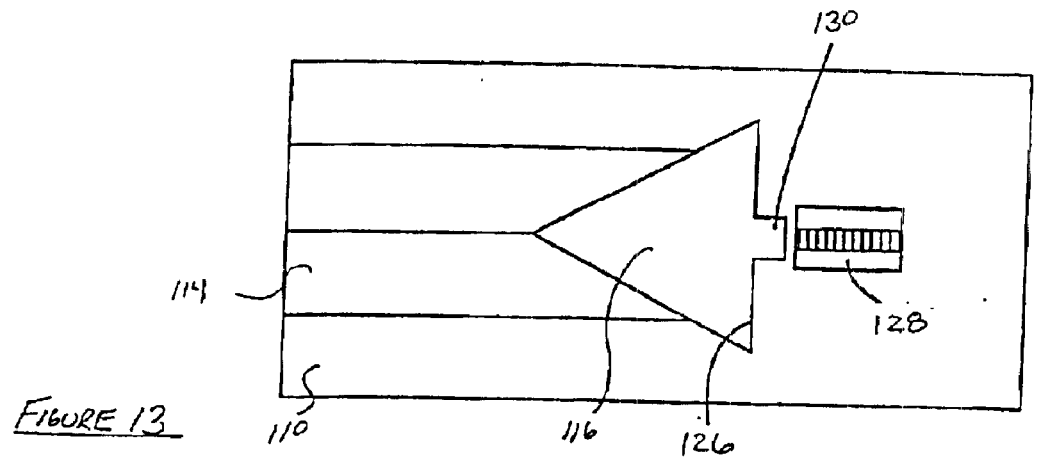
FIG. 13 is a top view of a substrate with a dry pit.
Figure 14:
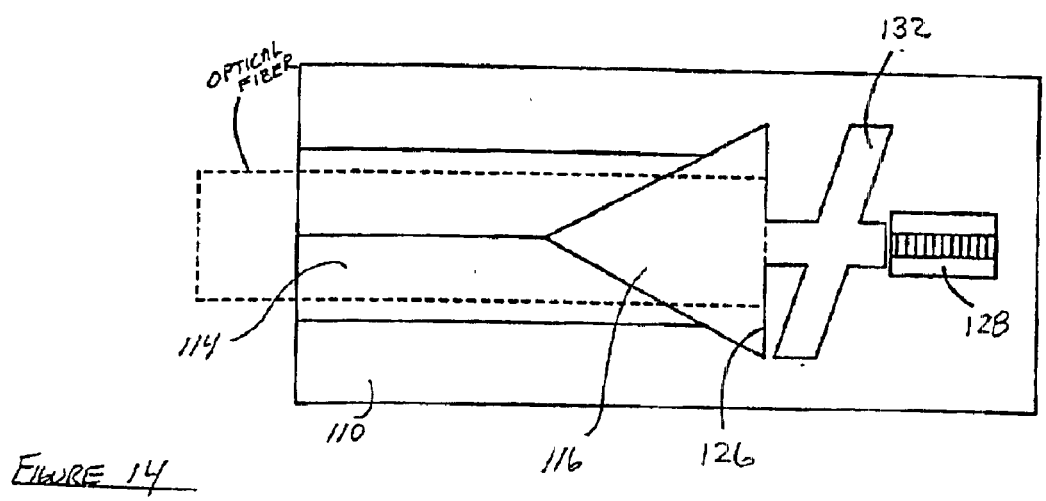
FIG. 14 is a top view of a substrate with a dry pit.

Referring to FIG. 11, in the present invention, the wedge 112 can be completely removed by shaping the dry pit 116 so that it surrounds the wedge area 120, where the wedge area 120 is defined by the points-of-contact 122. Referring to FIG. 12, complete elimination of the wedge 112 can thus be assured by making a triangularly-shaped dry pit 116 with an inside angled 124 of less than 90 degrees, centered on the V-groove 114. Referring to FIG. 13, in a particularly useful embodiment of the invention, an optical subassembly is provided with a V-groove 114 for a fiber, a dry pit 116 with a fiber stop 126, and a laser mount (e.g. solder pads) for a laser 128. The dry pit 116 can include an etched area 130 to allow for beam expansion. An advantage of this device is that a dicing saw cut is not required for a fiber stop 126. Referring to FIG. 14, in another embodiment, an additional slot 132 is provided for an optical device (e.g. a filter or lens). The slot 132 can be angled as shown.

Figure 15:
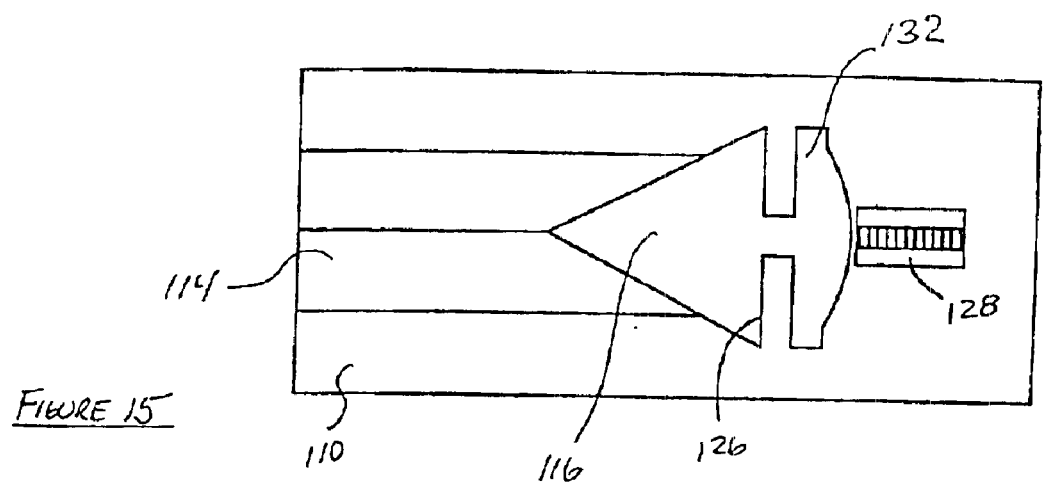
FIG. 15 is a top view of a substrate with a dry pit.
Figure 16:
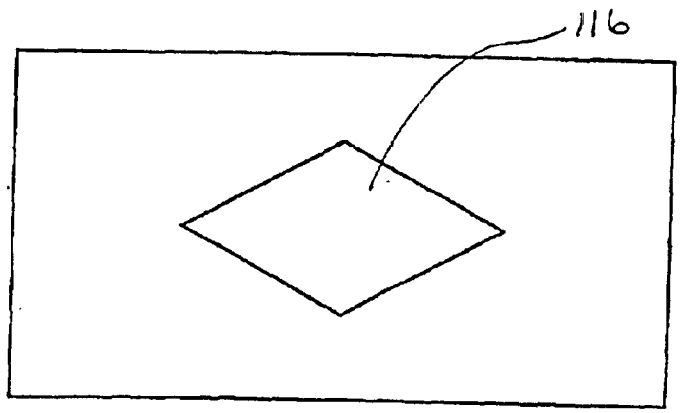
FIG. 16 is a top view of a substrate with a dry pit.
Figure 17:
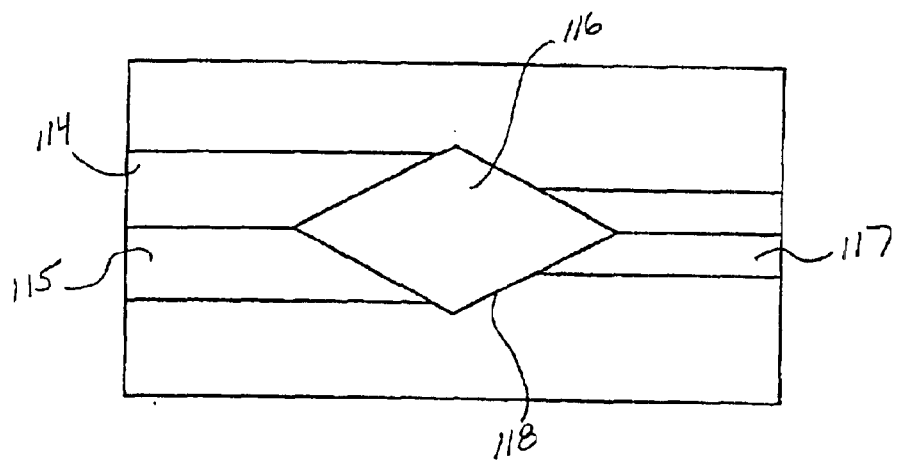
FIG. 17 is a top view of a substrate with a dry pit.
Figure 18:
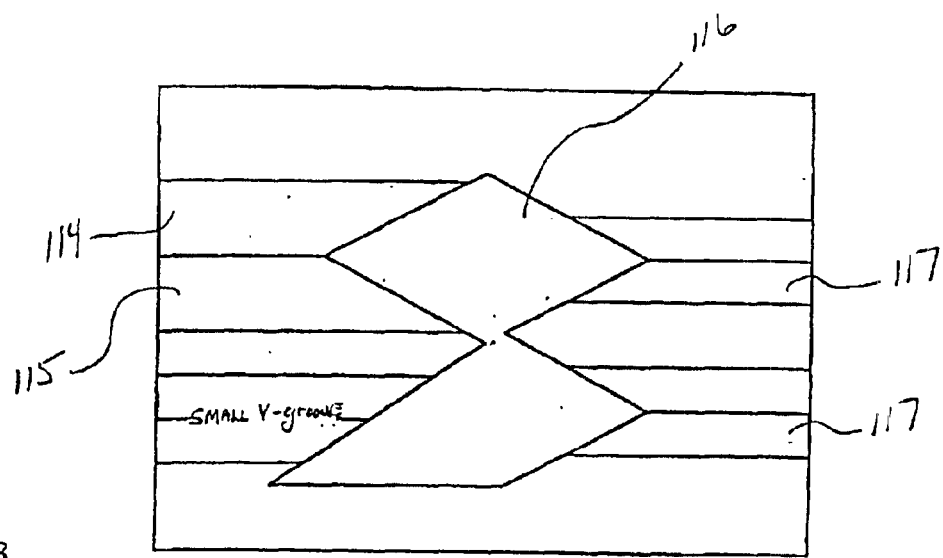
FIG. 18 is a top view of a substrate with a dry pit.
Figure 19:
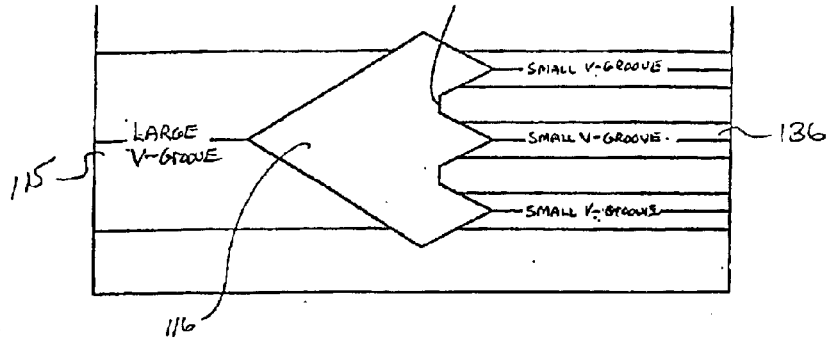
FIG. 19 is a top view of a substrate with a dry pit.
Figure 20:
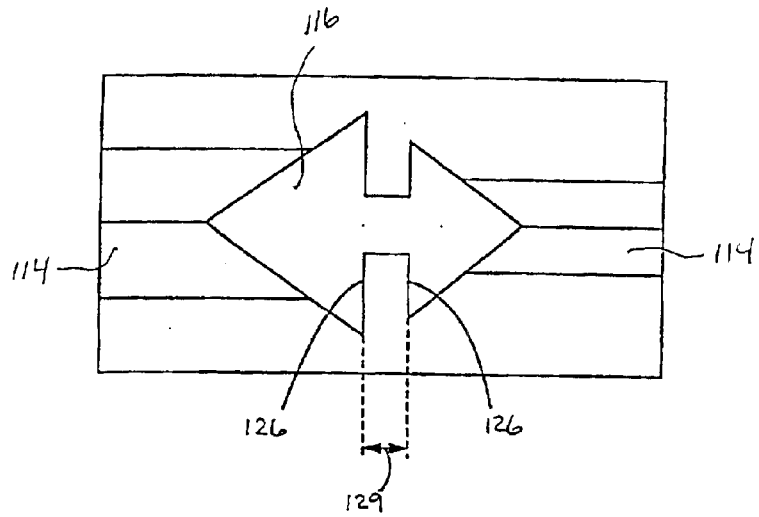
FIG. 20 is a top view of a substrate with a dry pit.
Figure 21:
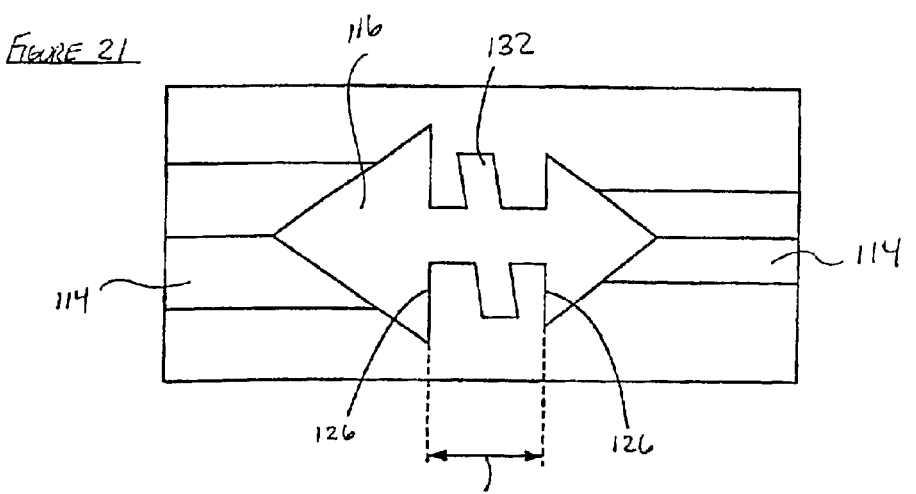
FIG. 21 is a top view of a substrate with a dry pit.

The slot 132 can also have a lens shape to fit a lens, as shown in FIG. 15. The present invention can also be used to join two V-grooves 114 having different sizes. If two different V-grooves 114 are joined, rapid undercut etching occurs. Mask design with corner compensation is used to correct for undercut etching. Referring to FIG. 16, to join two different-sized V-grooves 114, a dry pit 116 is formed at the area of intersection. The dry pit 116 may have a diamond shape. The dry pit 116 is coated with a mask material. Referring to FIG. 17, V-grooves 114 are formed aligned with the dry pit 116. The V-grooves 114 can have any width up to the width of the dry pit 116. Undercutetching will not occur because the sidewalls 118 of the dry pit 116 protect the silicon. The large V-groove 115 and small V-groove 117 shown in FIG. 17 are 'in-line'. Referring to FIG. 18, the dry pit 116 can be shaped to accommodate multiple fibers, GRIN lenses and the like. Referring to FIG. 19, the middle small V-groove 136 is in-line with the large V-groove 115. Also, referring to FIG. 20, the dry pit 116 can have built-in fiber stops 126. Built-in fiber stops 126 can provide an accurate distance 129 between fibers disposed in the V-grooves 114. Also, referring to FIG. 21, if optical devices (e.g. filters, lenses) are desired between the fibers, a slot 132 can be provided in the dry pit 116. The slot 132 can be provided between the fiber stops 126, for example.

Figure 22:
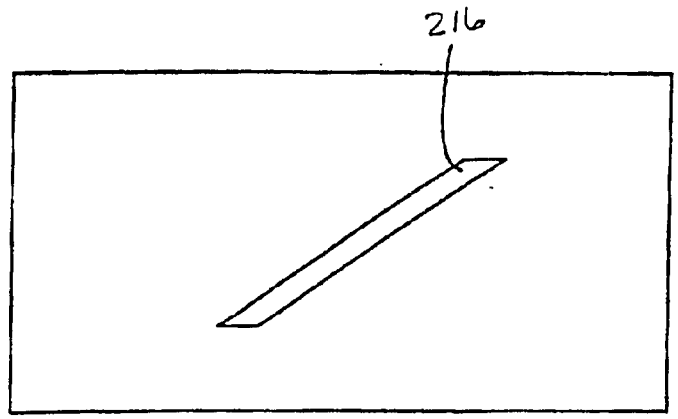
FIG. 22 is a top view of a substrate with a dry pit.
Figure 23:
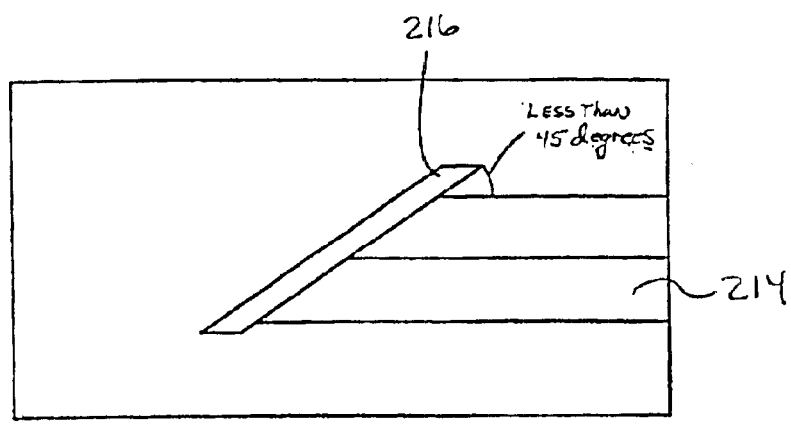
FIG. 23 is a top view of a substrate with a dry pit.
Figure 24:
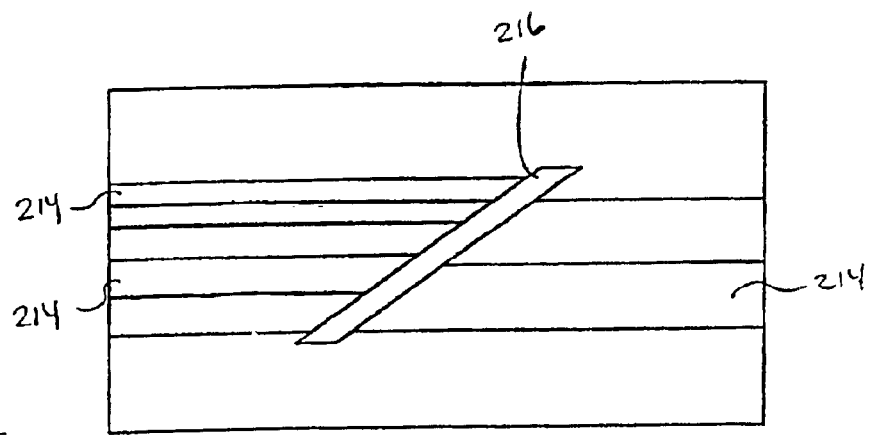
FIG. 24 is a top view of a substrate with a dry pit.
Figure 25:
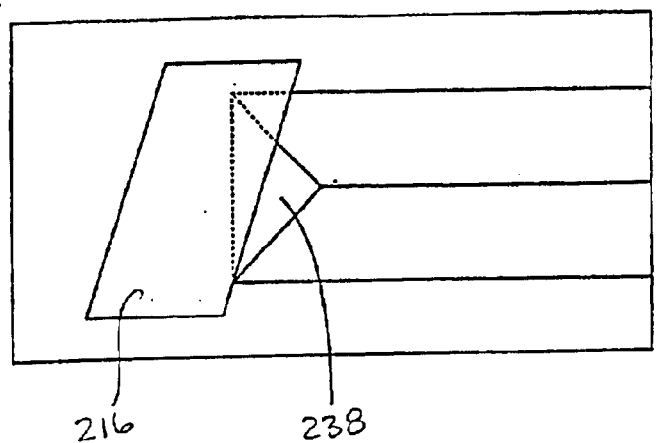
FIG. 25 is a top view of a substrate with a dry pit and a partial wedge.

In yet another embodiment of the invention, referring to FIG. 22, two V-grooves 214 are joined by an angled dry pit 216. The dry pit 216 does not need to be a diamond shape or a triangle. In the case of an angled dry pit 216, the dr pit 216 should be angled at greater than 45 degrees with respect to the V-grooves 214. Form a long dry pit 216 at an angle. The dry pit 216 can be very narrow compared to the width of the V-grooves 214 to be formed (e.g. the dry pit 216 can be 1/20 as wide as the V-grooves 214). As before, the dry pit 216 is conformally masked. Referring to FIG. 23, the V-grooves 214 are etched. It the dry pit 216 is angled at less than 45 degrees with respect to the V-groove length, then the wedges will not form in the V-grooves 214. Referring to FIG. 24, any number of V-grooves 214 can be created, and the V-grooves 214 can have different sizes. Referring to FIG. 25, if the dry pit 216 is angled at less than 45 degrees, than a partial wedge 238 will be created.

Figure 26:
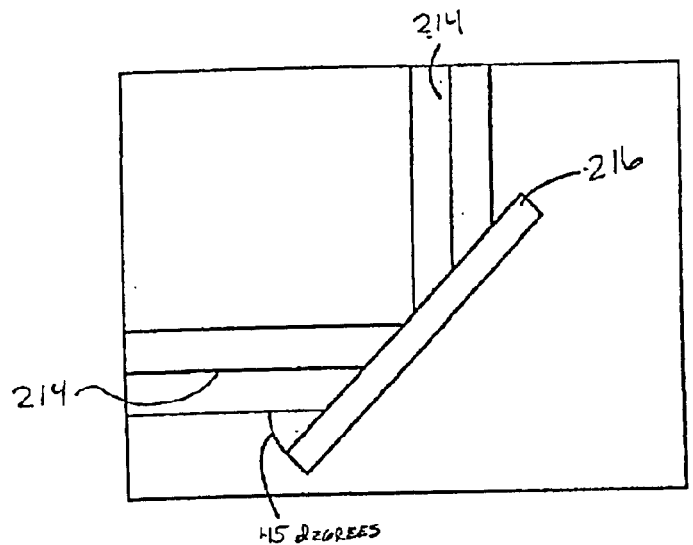
FIG. 26 is a top view of a substrate with a dry pit.
Figure 27:
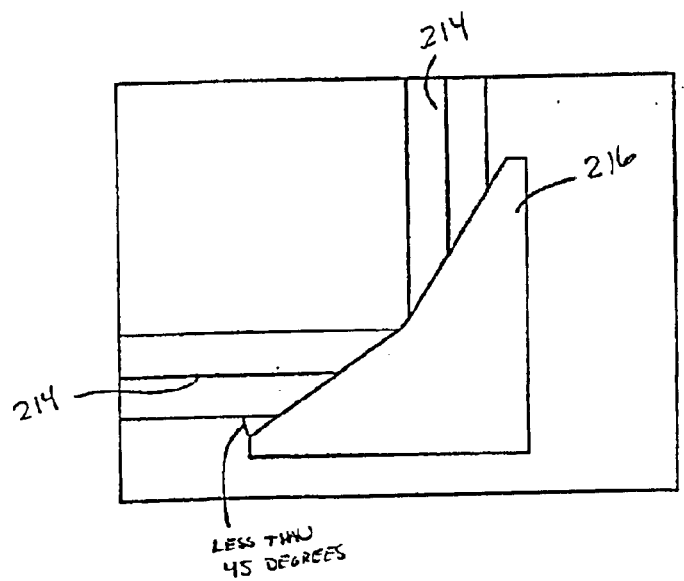
FIG. 27 is a top view of a substrate with a dry pit.
Figure 28:
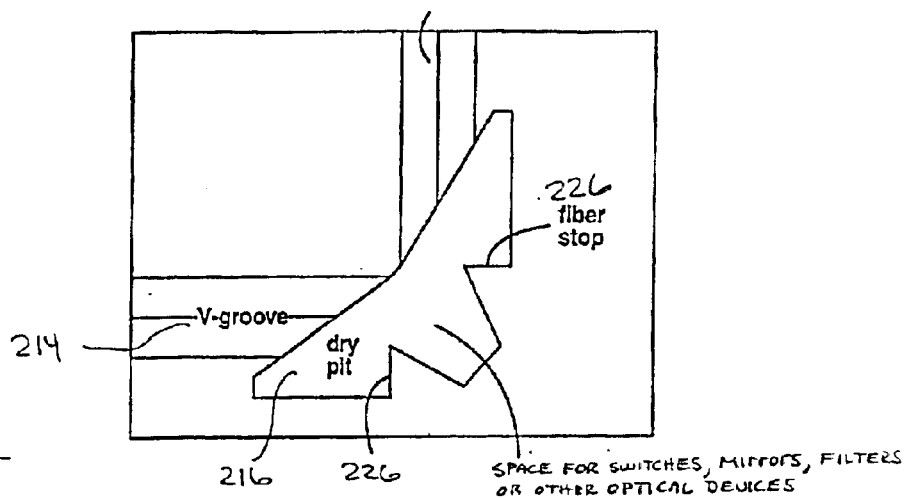
FIG. 28 is a top view of a substrate with a dry pit.
Figure 29:
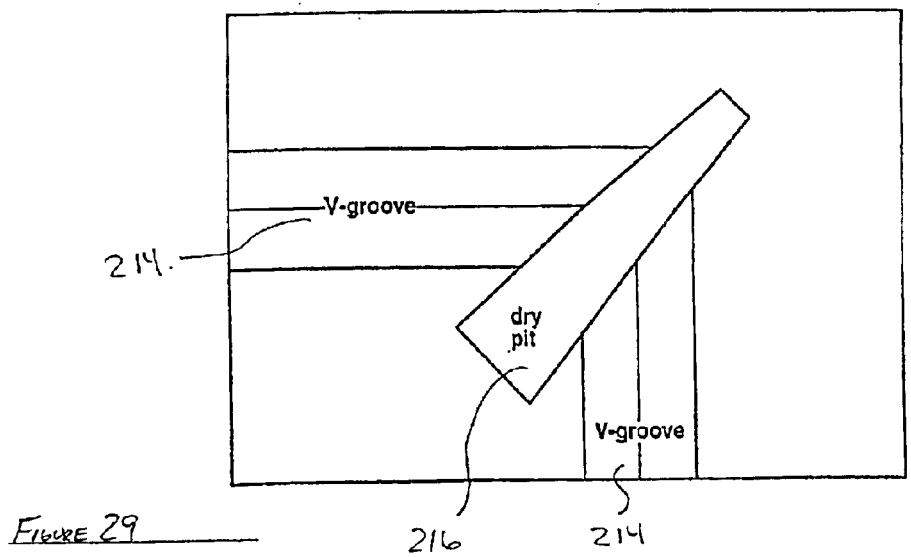
FIG. 29 is a ton view of a substrate with a dry pit.
Figure 30:
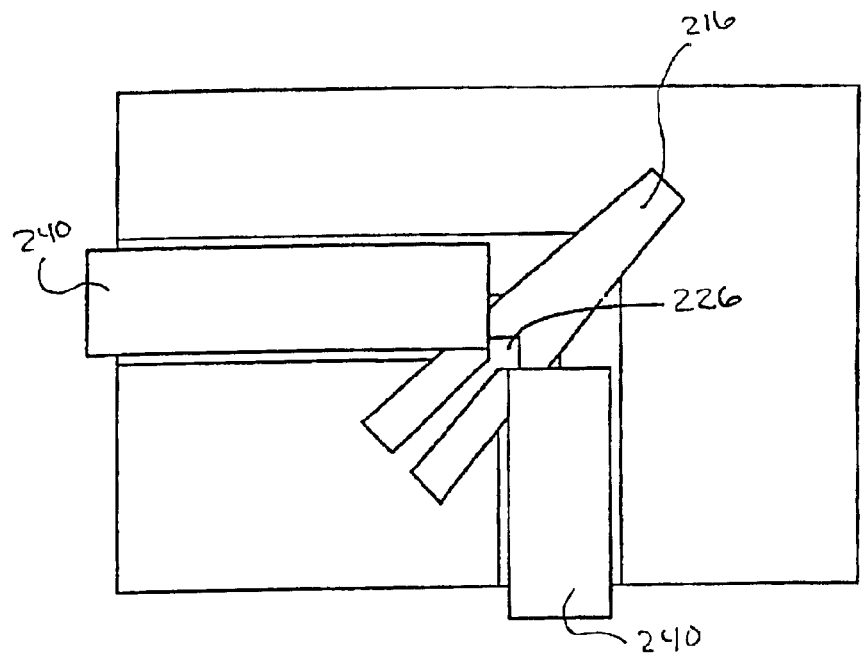
FIG. 30 is a top view of a substrate with a dry pit and optical fibers.
Figure 31:
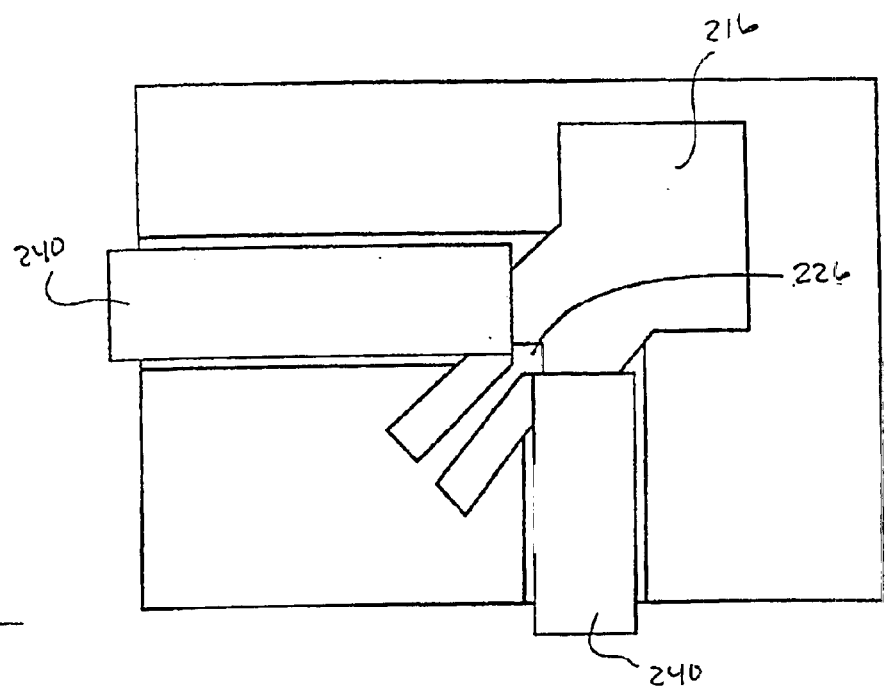
FIG. 31 is a top view of a substrate with a dry pit and optical fibers.

Referring to FIG. 26. V-grooves 214 can be aligned at right angles. A dry pit 216 prevents the formation of wedges. The V-grooves 214 can intersect the dry pit 216 at exactly 45 degrees, but this is not preferred. If wedges are not wanted, then the dry pit 216 should be shaped so that all V-grooves 214 intersect the dry pit 216 at less than 45 degrees. Referring to FIG. 27, the dry pit 216 intersects each V-groove 214 at a angle slightly less than 45 degrees so that wedges are not formed. Referring to FIG. 28, fiber stops 226 can be added. Also, optical devices such as filters, lenses, and micromechanical switches can be placed in the dry pit 216. Referring to FIG. 29, V-grooves 214 can be aligned at 90 degrees across the dry pit 216, as shown. In this case, the dry pit 216 can be wedge shaped (as shown) so that each V-groove 214 intersects the dry pit 216 at an angle less than 45 degrees. Referring to FIG. 30, the dry pit 216 can have a post that functions as a fiber stop 226 for both fibers 240. Optical devices can be disposed in the dry pit 216. Referring to FIG. 31, the dry pit 216 can be enlarged to provide space for optical devices. The dry pit 216 should be designed so that wedges are avoided, or so that wedges are so small that they do not contact the optical fibers 240.

Figure 32:
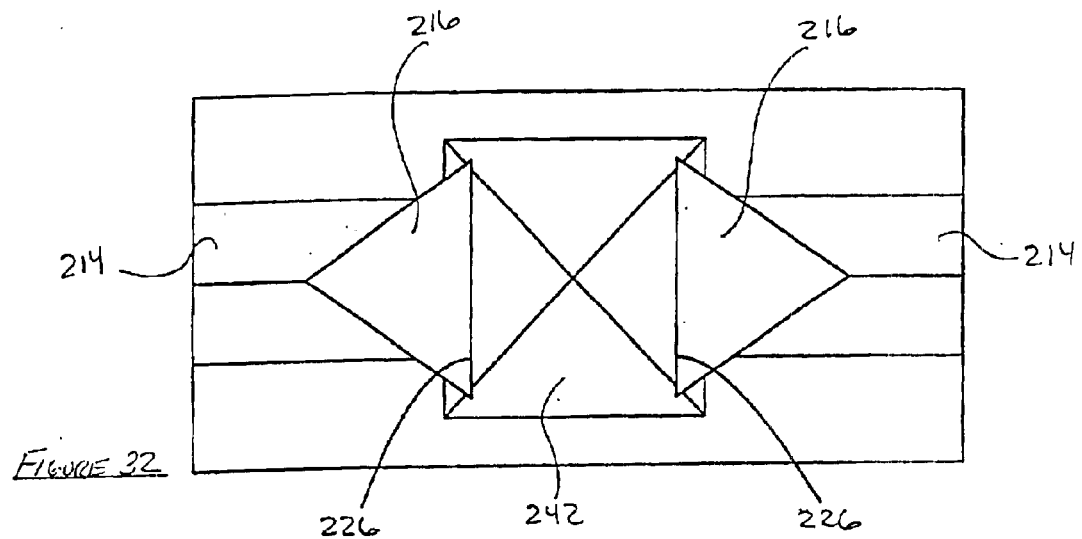
FIG. 32 is a top view of a substrate with a dry pit and a wet pit.
Figure 33:
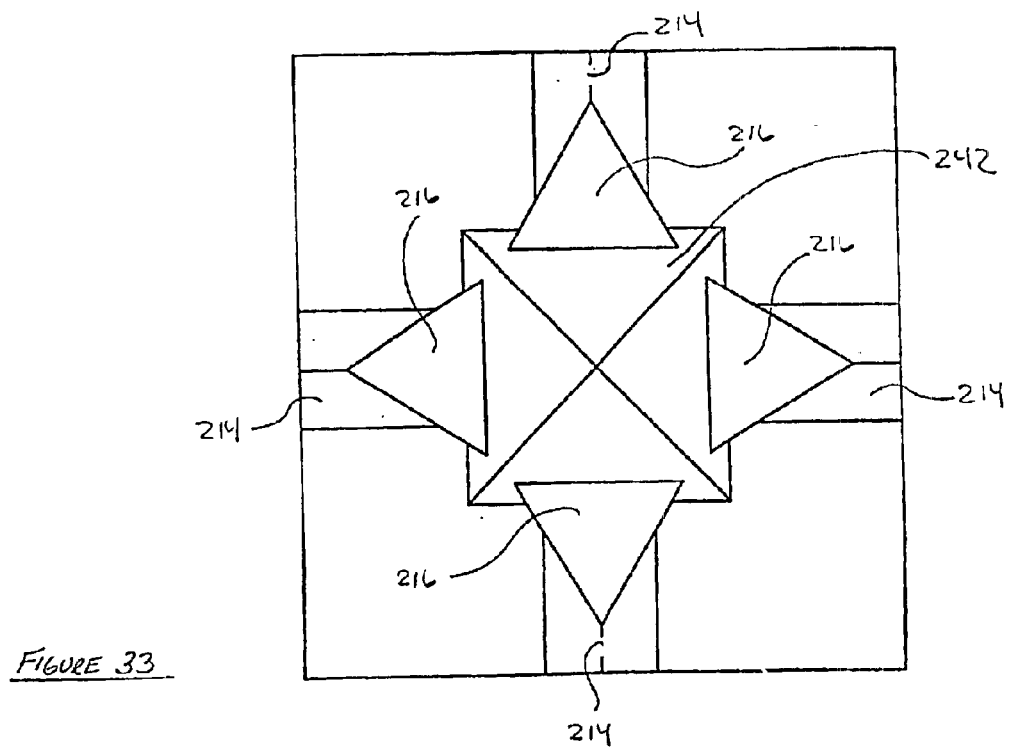
FIG. 33 is a ton view of a substrate with a dry pit and a wet pit.
Figure 34:
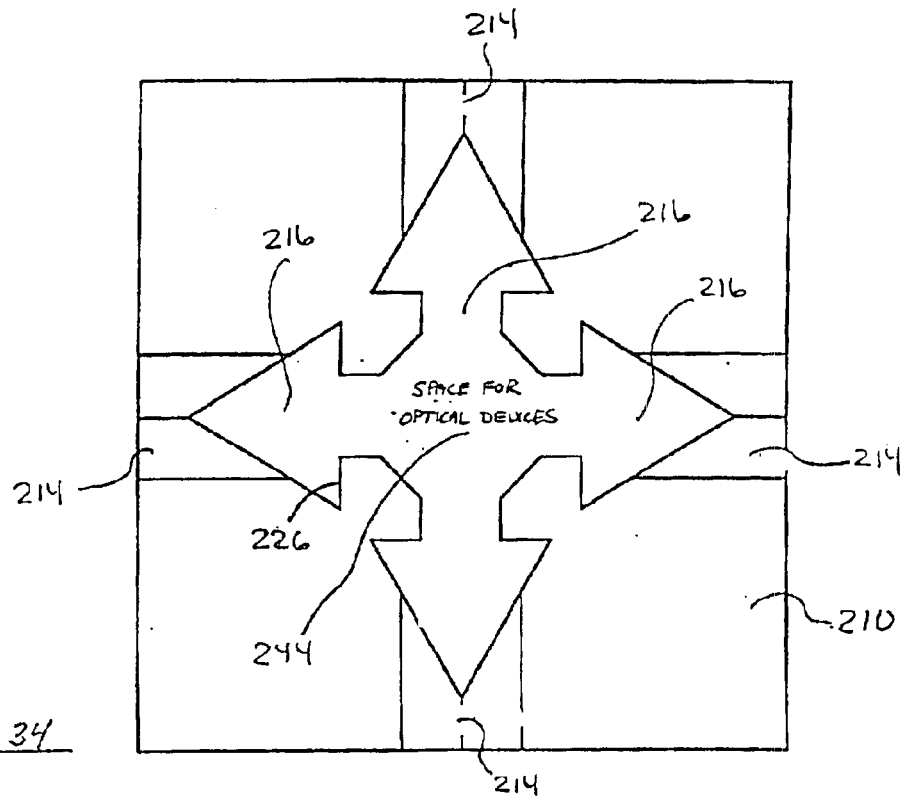
FIG. 34 is a top view of a substrate with a dry pit and a V-groove.
Figure 35:
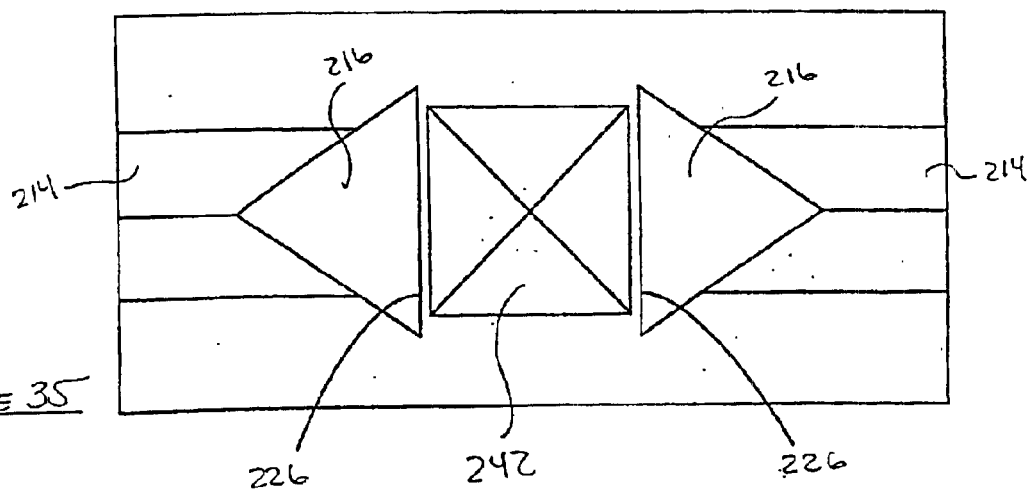
FIG. 35 is a top view of a substrate with a dry pit a wet pit and a V-groove.

Referring to FIG. 32, the present invention is also useful for subassemblies having both V-grooves 214 and wet etched pits 242. Optical fibers 240 can go into the V-grooves 214, and ball lenses can go into the wet pits 242. The dry pits 216 of the present invention assure that an optical path between the V-groove 214 and the wet pit 242 is not blocked by a wedge. FIG. 32 is a device that can hold a fiber-lens-fiber arrangement. Fiber stops 226 are provided for the fibers 240, and the wet pit 242 hold the ball lens. Of course, optical devices other than ball lenses can be disposed in the wet pit 242. Referring to FIG. 33, a four-V-groove device can also be made. Referring to FIG. 34, a four-V-groove device can be made with a dry pit 216 (instead of a wet pit 242) for holding optical devices. Each V-groove 214 has associated fiber stops 226, and there is space 244 in the middle of the dry pit 216 for mirrors, micromechanical devices, filters lenses and the like. For example, a microopticalmechanical device can be placed face down on the substrate 210 so that optical devices are disposed within the volume of the dry pit 216. Referring to FIG. 35, the wet pit 242 can also be separated from the dry pits 216.

Figure 36:
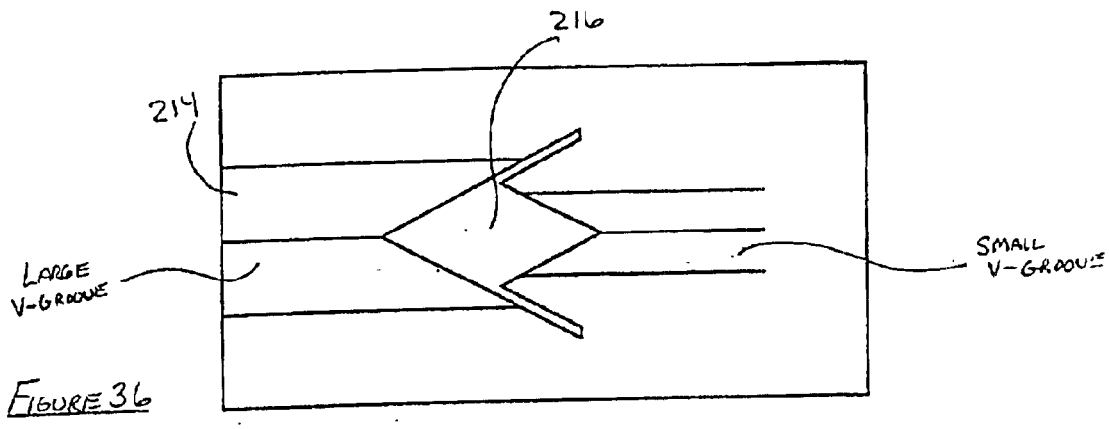
FIG. 36 is a top view of a substrate with a dry pit.
Figure 37:
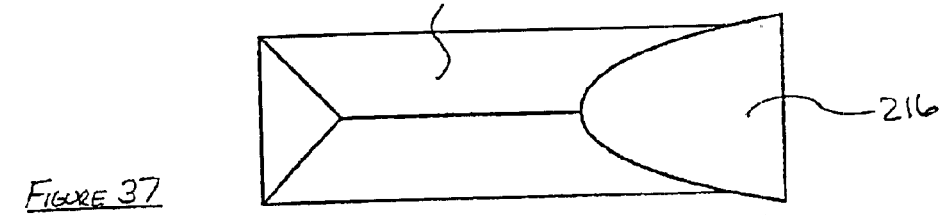
FIG. 37 is a top view of a substrate with a dry pit.
Figure 38:
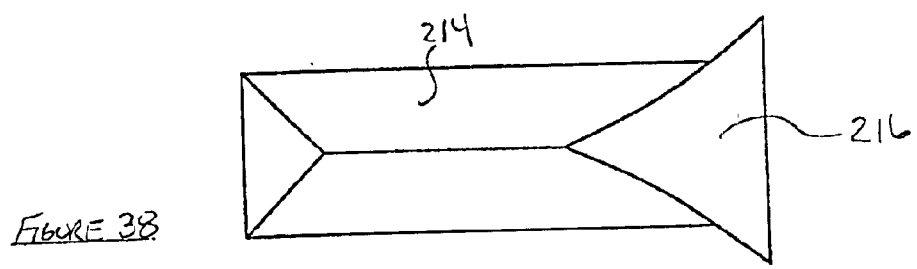
FIG. 38 is a top view of a substrate with a dry pit.

The present invention includes another way to join V-grooves 214. Referring to FIG. 36, a V-shaped dry pit 216 can be used to join V-grooves 214. A V-shaped dry pit 216 allows the V-grooves 214 to be more closely spaced than a triangular dry pit 216. In order to eliminate the wedge, the dry pit 216 can have any shape that circumscribes the wedge area. For example, referring to FIG. 37 and FIG. 38, dry pits 216 as shown can be used.

Figure 39:
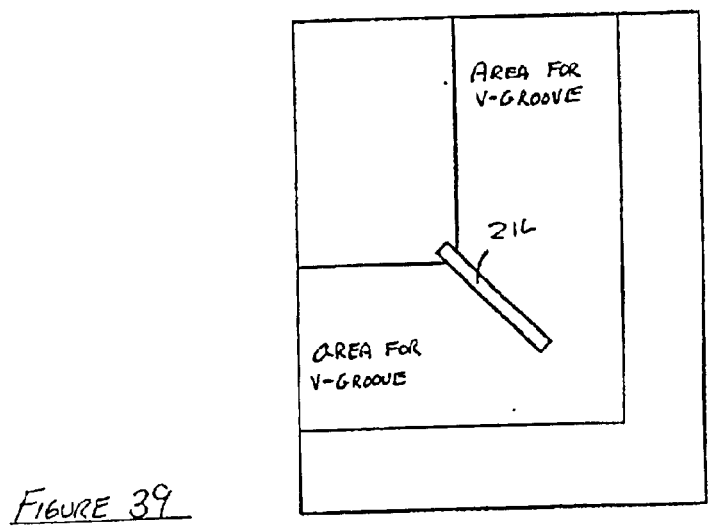
FIG. 39 is a top view of a substrate with a dry pit and a V-groove area.
Figure 40:
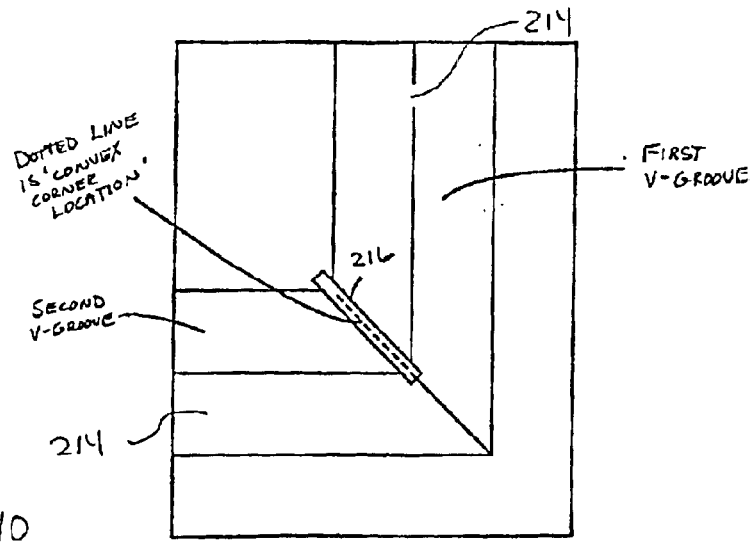
FIG. 40 is a top view of a substrate with a dry pit and a V-groove.
Figure 41:
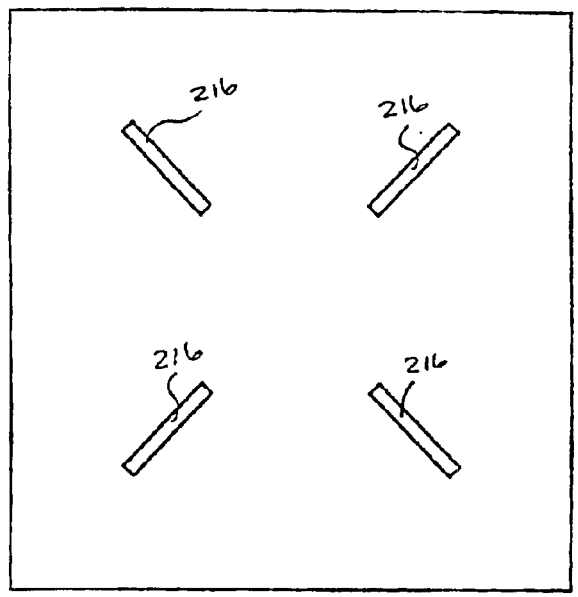
FIG. 41 is a top view of a substrate with four dry pits.
Figure 42:
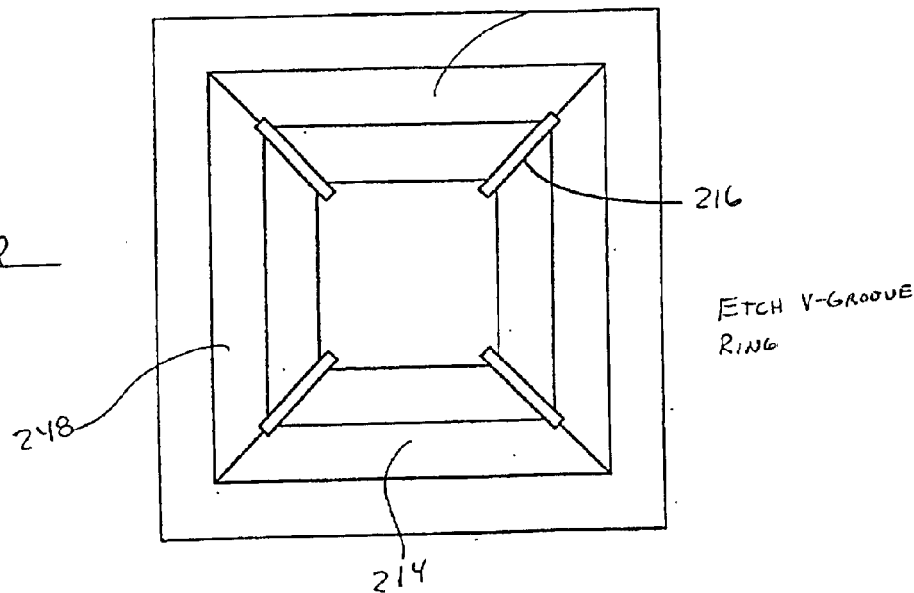
FIG. 42 is a top view of a substrate with four dry pits and a V-groove ring.

The present invention can also be used to obviate corner compensation in V-grooves 214 having a 90-degree bend. A dry pit 216 is formed at the inside corner of the 90 degree bend. Referring to FIG. 39, form a dry pit 216 where the inside corner would be. The dry pit 216 is conformally coated with a mask material. Referring to FIG. 40, the V-groove 214 is then etched. The entire 90 degree bend can be etched in a single step. The inside corner does not etch because it is protected by the mask material within the dry pit 216. The corner-protection technique can be used to make a V-groove ring 248, for example. FIG. 41 shows the forming of four dry pits 216 at locations of the convex corners. FIG. 42 shows an etch V-groove ring 248.

Figure 43:
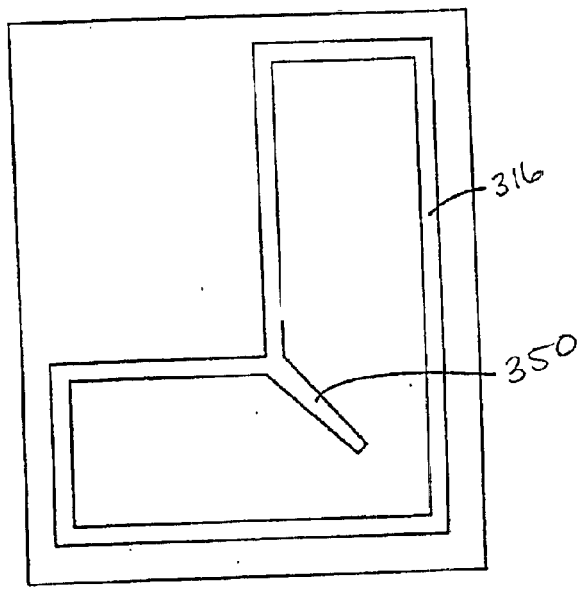
FIG. 43 is a top view of a substrate with a dry pit.
Figure 44:
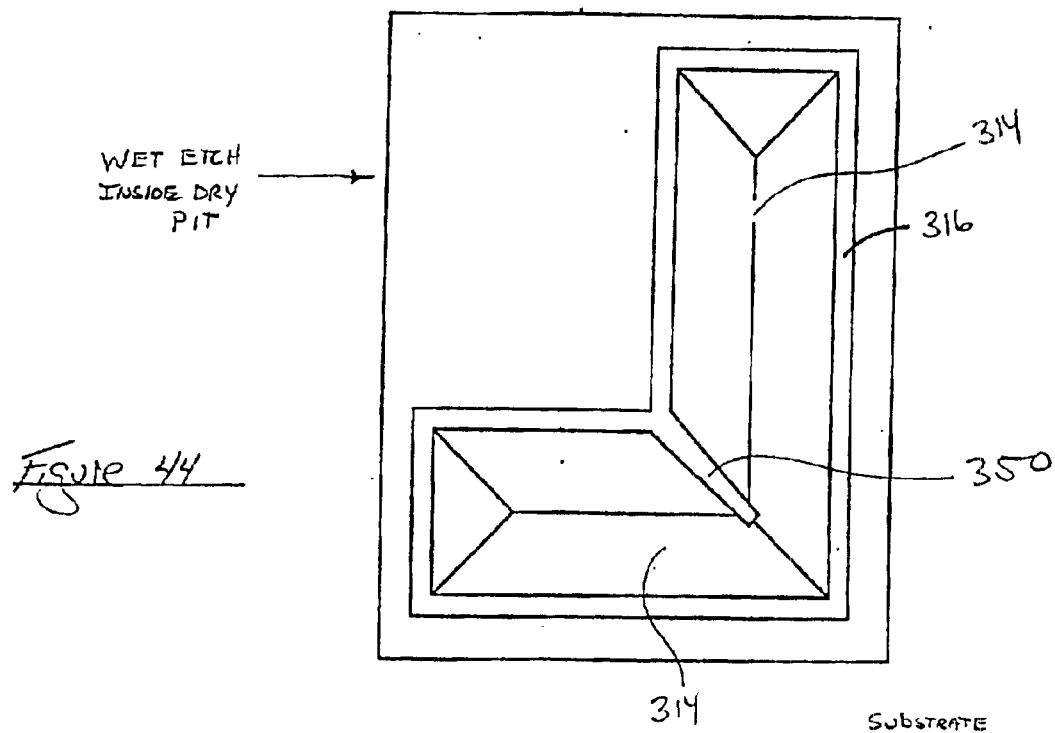
FIG. 44 is a top view of a substrate with a dry pit and a V-groove.
Figure 45:
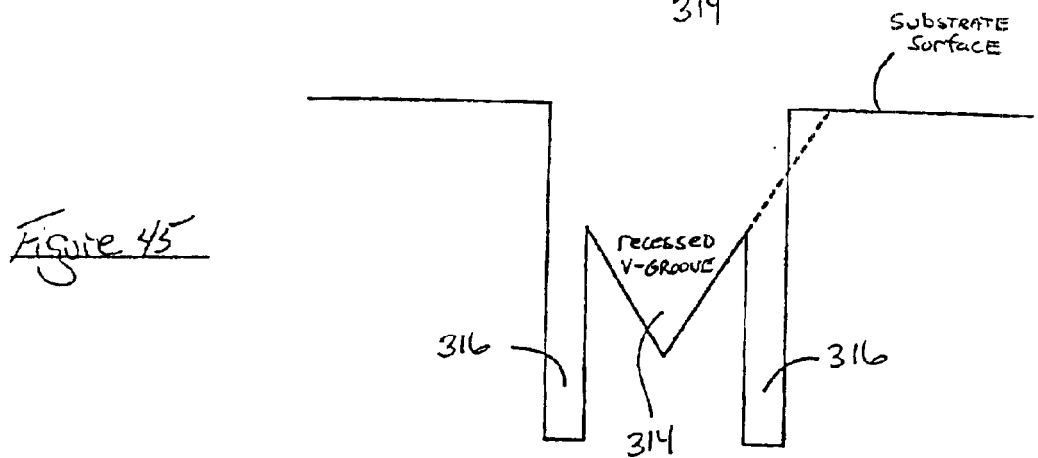
FIG. 45 is a cross-sectional view of a substrate showing a recessed V-groove.
Figure 46:
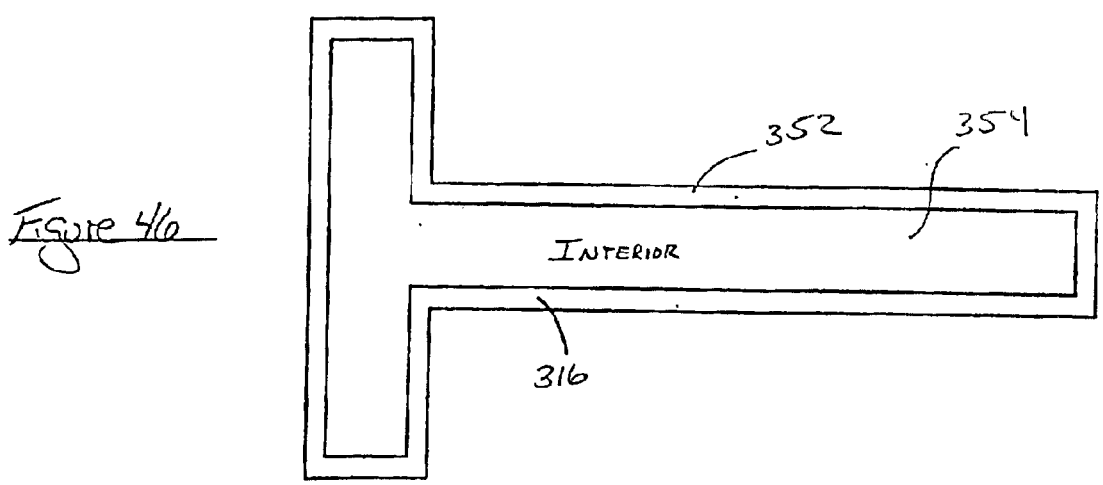
FIG. 46 is a top view of a T-shaped dry pit ring.
Figure 47A:
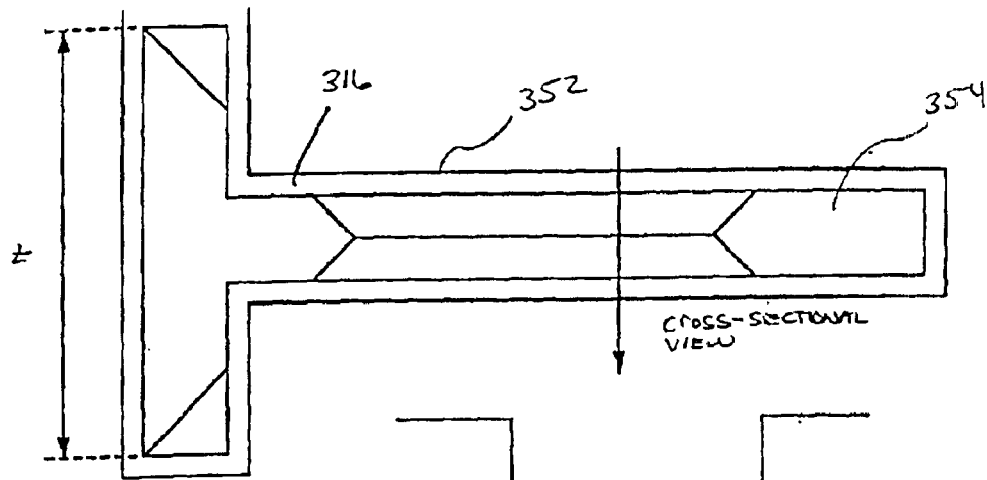
FIG. 47A is a top view of T-shaped dry pit ring.
Figure 47B:
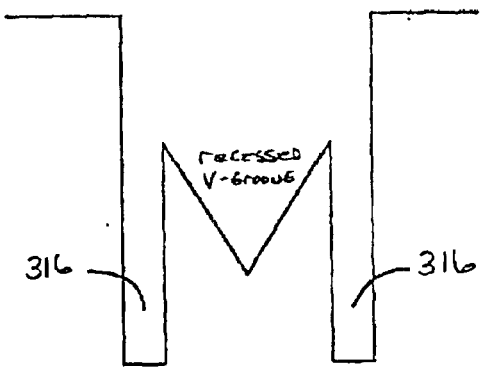
FIG. 47B is a cross-sectional view of a T-shaped dry pit ring showing a recessed V-groove.
Figure 48:
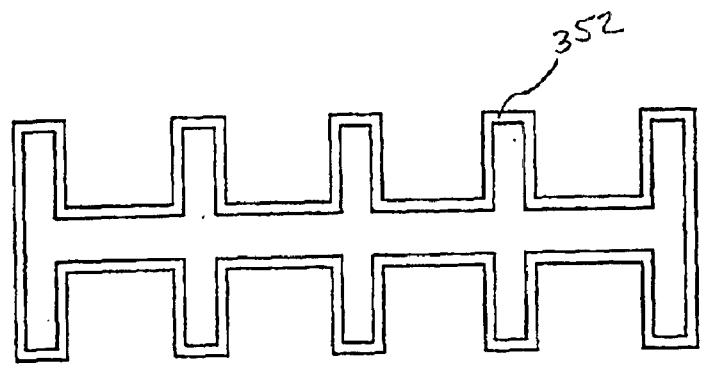
FIG. 48 is a top view of a dry pit ring having multiple wide portions.

In yet another embodiment, the dr pit 316 circumscribes the entire V-groove 314. Referring to FIG. 43, the dry pit 316 may protect the exposed convex corner area 350. The mask material on the sidewalls of the dr pit 316 prevents the convex corner area 350 from etching. FIG. 44, illustrates wet etch inside dry pit 316. The present invention can also be used to make 'recessed' V-grooves 314. FIG. 45 is a cross-sectional view showing a recessed V-groove 314. The recessed V-groove 314 cannot be made by etching deeply. Referring to FIG. 46, a recessed V-groove 314 can be made by forming a T-shaped dry pit ring 352. The interior 354 of the T-shaped dry pit ring 352 is not dry etched. Referring to FIGS. 47A and 47B, the interior 354 of the T-shaped dry pit ring 352 is wet etched and the width t determines the depth of the recessed V-grooves 314. Referring to FIG. 48, in order to make a long recessed V-groove 314, multiple wide portions can be incorporated into the dry pit ring 352.

Figure 49:
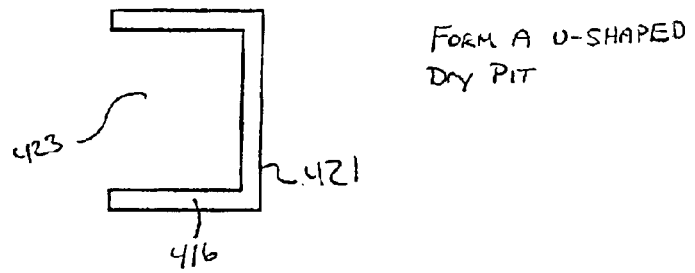
FIG. 49 is a top view of a U-shaped dry pit.
Figure 50:
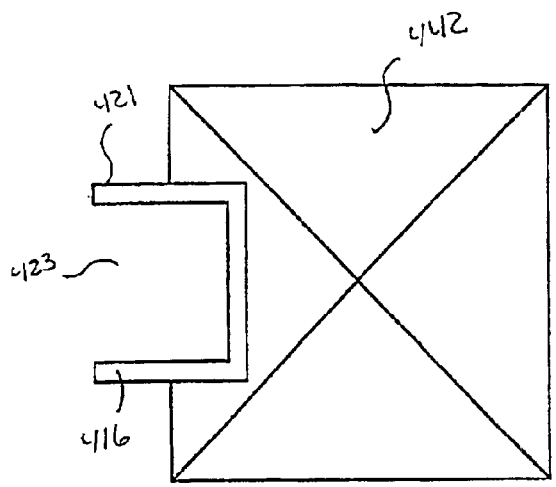
FIG. 50 is a top view of a U-area protected from a wet etch by a dry pit.
Figure 51:
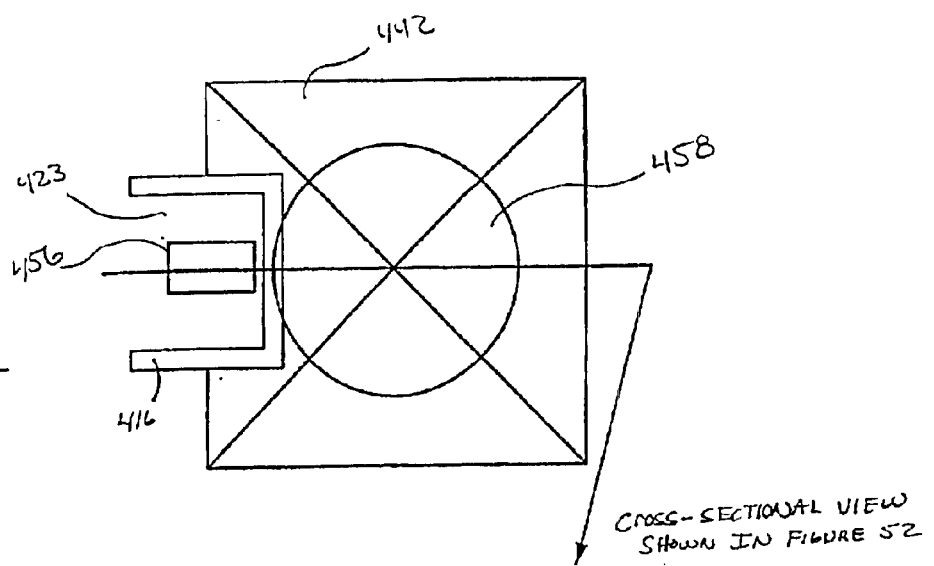
FIG. 51 is a top view of a U-area protected from a wet etch by a dry pit.
Figure 52:
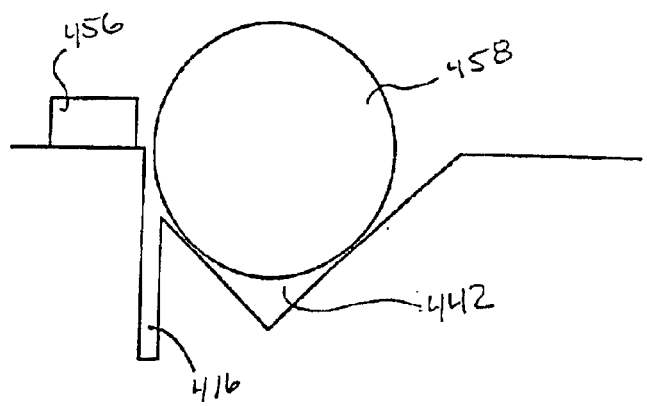
FIG. 52 is a cross-sectional view of a U-area protected from a wet etch by a dry pit.
Figure 53:
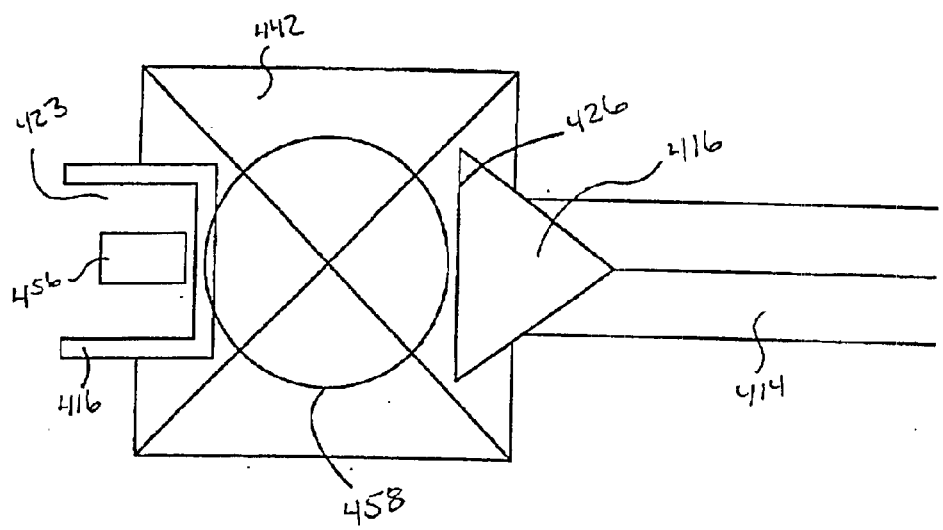
FIG. 53 is a top view of a U-area protected from a wet etch by a dry pit.
Figure 54:
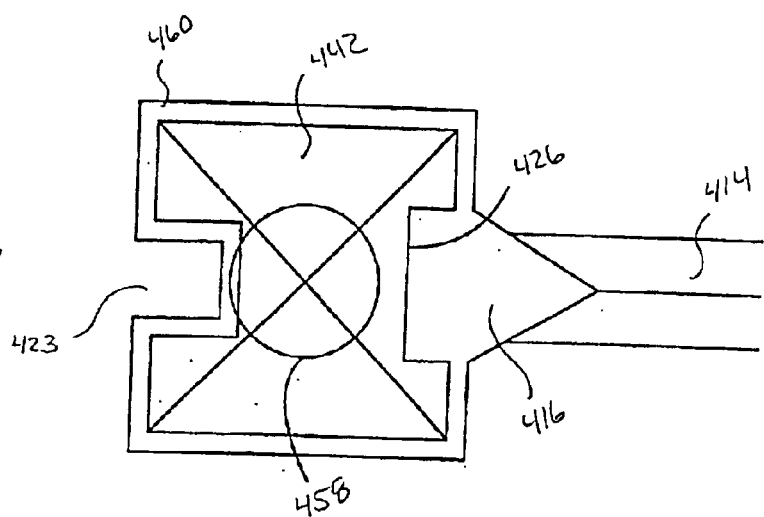
FIG. 54 is a top view of a U-area protected from a wet etch by a dry pit.

Another embodiment of the present invention provides a structure form placing a laser chip very close to a ball lens. This is desirable in a number of optoelectronic subassemblies (see for example, U.S. Pat. No. 5,911,021). Referring to FIG. 49, form a U-shaped dry pit 416. Wet etch a pit 442 that intersects the U-shape 421, as shown in FIG. 50. The U-area 423 should not be wet-etched. The U-area 423 is protected from the wet etch by the dry pit 416. Referring to FIG. 51 and FIG. 52, when a laser 456 is disposed on the U-area 423, and a ball lens 458 is disposed in the wet pit 442, the laser 456 can be quite close to the ball lens 458. Specifically, the laser 456 can be closer to the ball lens 458 in the present structure than in a conventional structure with just a wet pit 442 and a laser 456 disposed adjacent to the wet pit 442. This structure provides increased heat dissipation for the laser 456, and allows the use of high-index ball lenses 458, thereby reducing spherical aberration. Referring to FIG. 53, the laser-lens structure can be combined with a V-groove 414 by a dry pit 416 (e.g. a triangular dry pit). An optical fiber can be disposed in the V-groove 414, and the dry pit 416 can provide a fiber stop 426. Referring to FIG. 54, the dry pit 416 can be a ring 460 extending around the wet pit 442. In this case, the wet pit 442 size is determined by the dry pit 416. The dry pit 416 can include features for a fiber stop 426 and eliminating the wedge in the V-groove 414.

Figure 55:
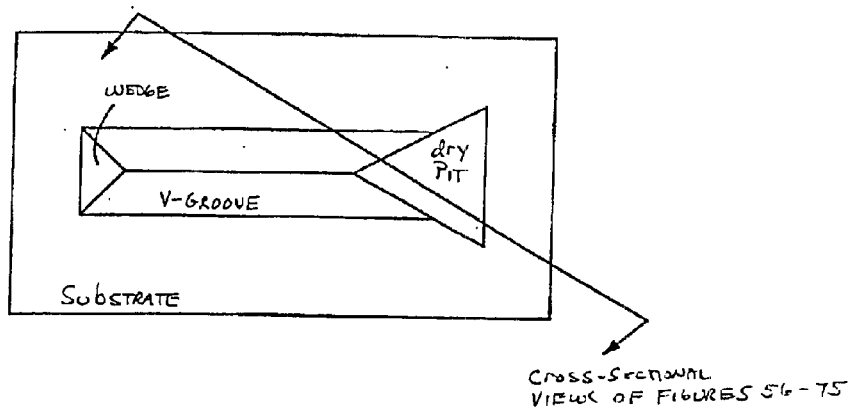
FIG. 55 is a top view of an etched substrate.
Figure 56:
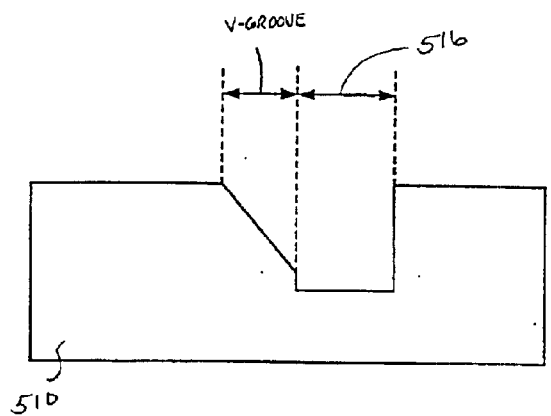
FIG. 56 is a cross-sectional view of an etched substrate.

The present invention may be used with SOI wafers so that the dry etch process has an etch stop. The present invention can be used on <100> wafers and <110> wafers. The present invention, can be used with silicon and other materials such as GaAs, InP. FIGS. 57–75 are cross sectional views illustrating methods in the present invention. The cross sectional views are from a substrate etched as shown below. Referring to FIG. 55 and FIG. 56, an exemplary cross sectional view is shown below, also.

Figure 57:
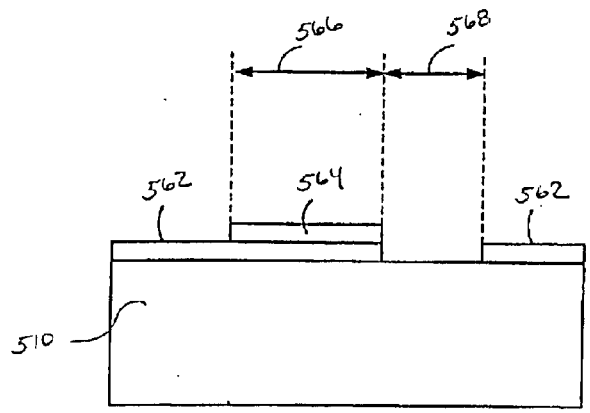
FIG. 57 is a cross-sectional view of a substrate according to a first method.
Figure 58:
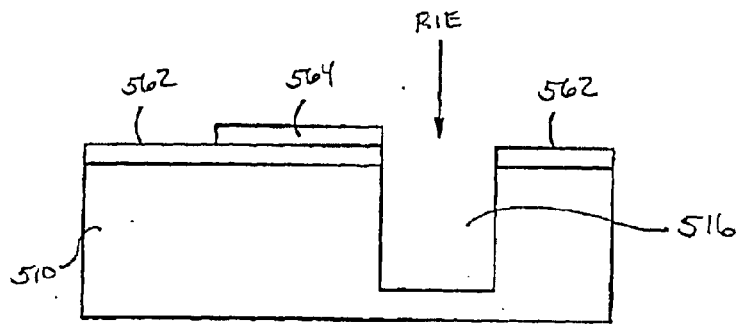
FIG. 58 is a cross-sectional view of a substrate according to a first method.
Figure 59:
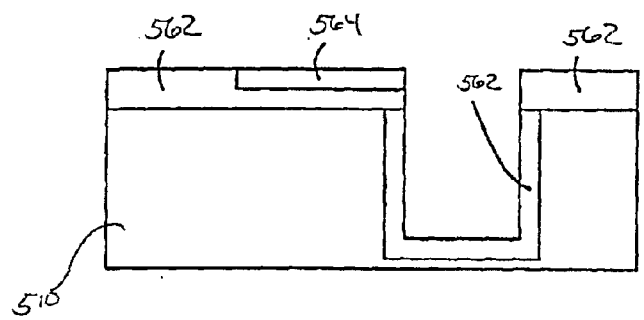
FIG. 59 is a cross-sectional view of a substrate according to a first method.
Figure 60:
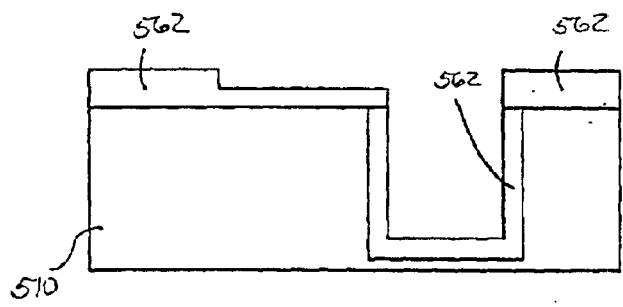
FIG. 60 is a cross-sectional view of a substrate according to a first method.
Figure 61:
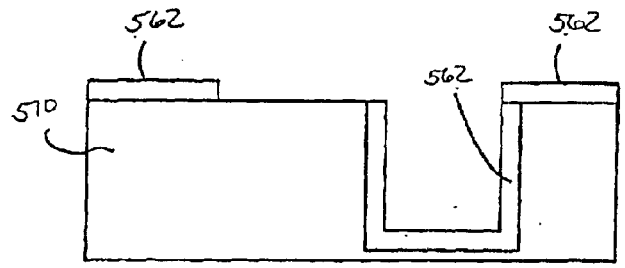
FIG. 61 is a cross-sectional view of a substrate according to a first method.
Figure 602:
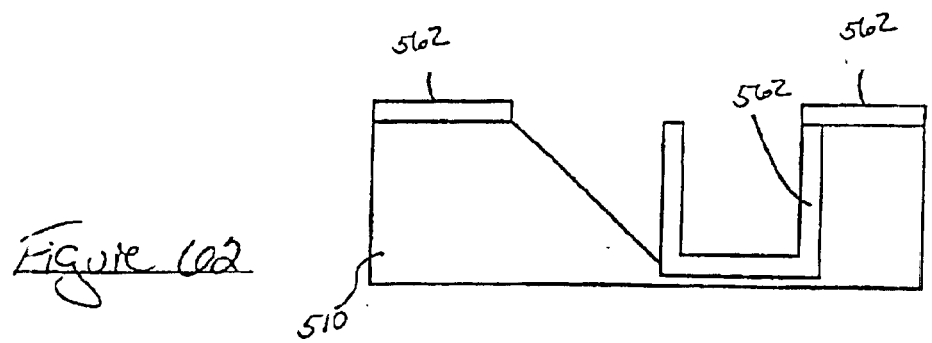
Figure 603:
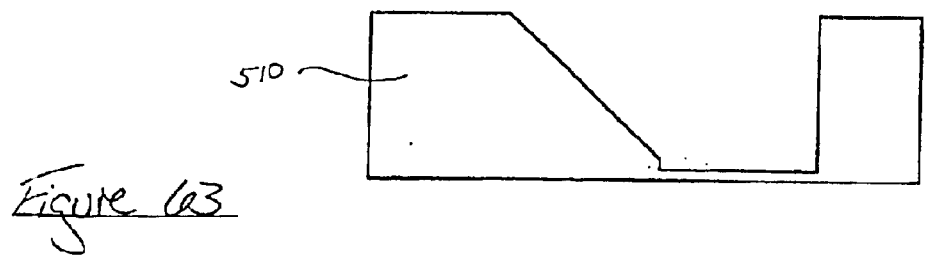
Figure 604:
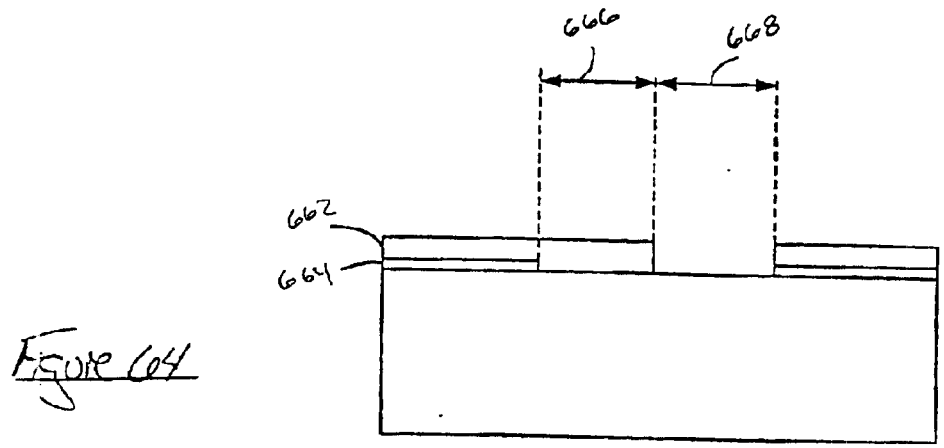
Figure 605:
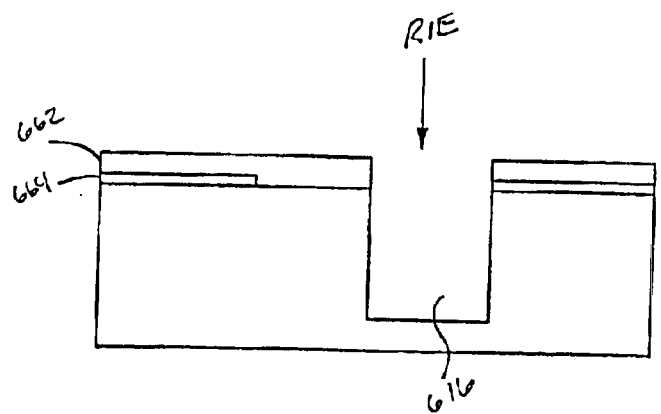

Combined wet and dry etching can be performed according to a number of different methods. The dry pit 516 can be coated with CVD nitride or oxide, or can be thermally oxidized. The present invention can be used with silicon or other materials (e.g. GaAs) that can be dry etched wet etched (isotropic or anisotropic) and can be conformally coated with a mask material. Referring to FIGS. 57–63, below is a first embodiment for making the structures of the present invention. Referring- to FIG. 57 start with a silicon substrate 510. Deposit and pattern an SiO2 layer 562 and a nitride layer 564. The SiO2 layer 562 should be thick enough to serve as a mask during the dry etch step. (e.g. the SiO2 layer can be about 2 microns thick for a 100 micron deep dry pit 516). The patterns in the oxide and nitride determine the wet etch area 566 and dry etch area 568 as shown. Referring to FIG. 58, the dry pit 516 is formed. The dry pit 516 can be performed by reactive ion etching, plasma etching, ion milling or any other directional process. Referring to FIG. 59, the wafer is thermally oxidized. The sidewalls are necessarily oxidized in this step. The thermal oxidation step causes the oxide layer 562 to thicken in areas outside of the nitride 564. Referring to FIG. 60, the nitride 564 is removed. This can be done with a wet etch. Referring to FIG. 61, a short duration of oxide etch (wet or dry) removes the oxide 562 that was under the nitride 564. Other oxide areas remain intact because they are thicker. Referring to FIG. 62, the wafer 510 is exposed to an anisotropic wet etch. KOH should not be used because it will attack the oxide 562. EDP or TMAH can be used because they will not attack the oxide 562 as strongly. Referring to FIG. 63, optionally, the oxide mask material is removed. This can be done in a dilute HF etch.

Figure 66:
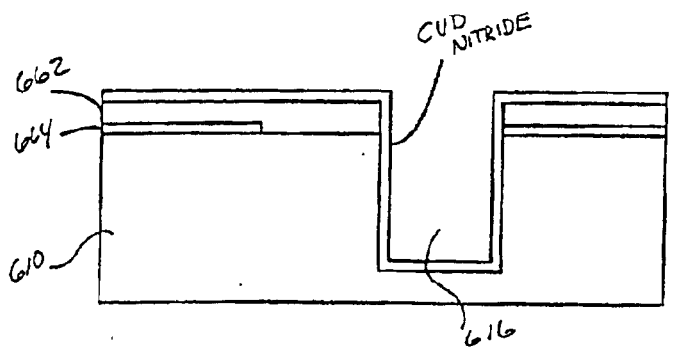
FIG. 66 is a cross-sectional view of a substrate according to a second method.
Figure 67:
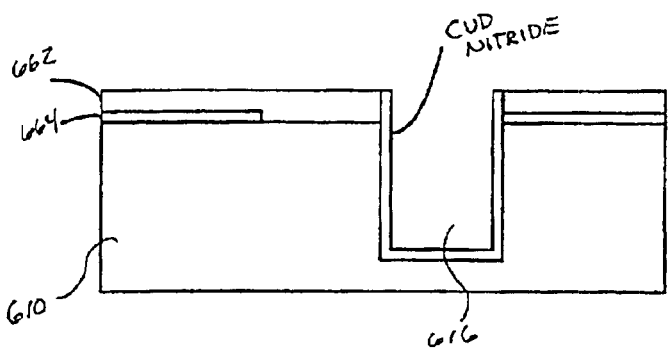
FIG. 67 is a cross-sectional view of a substrate according to a second method.
Figure 68:
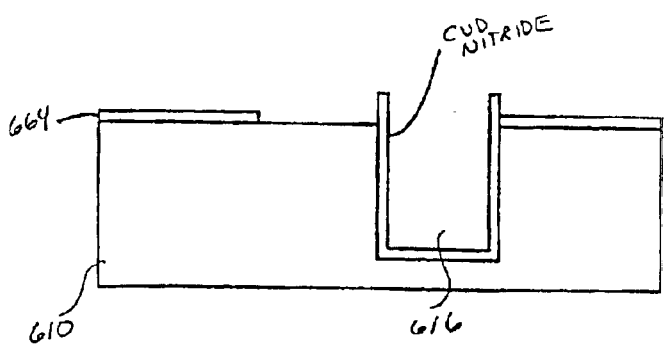
FIG. 68 is a cross-sectional view of a substrate according to a second method.
Figure 69:
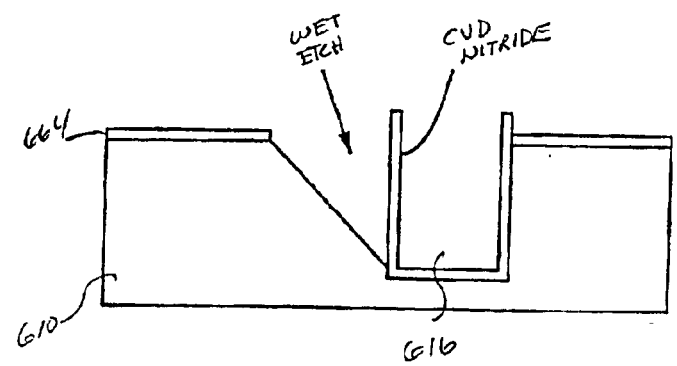
FIG. 69 is a cross-sectional view of a substrate according to a second method.
Figure 70:
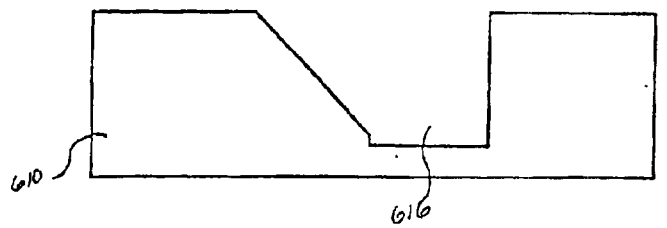
FIG. 70 is a cross-sectional view of a substrate according to a second method.

Referring to FIGS. 64–70, a second method is described. Referring to FIG. 64, deposit/pattern nitride layer 664, and then deposit/pattern oxide layer 662. The oxide layer 662 can be thicker than the nitride layer 664. The oxide layer 662 can comprise PSG or BPSG, for example. The nitride 664 and oxide 662 patterns determine the wet etch area 666 and dry etch area 668 as shown. Referring to FIG. 65, etch the dry pit 616. This can be done with RIE, ion milling or similar processes. Referring to FIG. 66, conformally coat the wafer 610 with CVD nitride. The dry pit 616 is coated with nitride. Referring to FIG. 67 planarize or polish the wafer 610 so that nitride is removed from the top surface only. Referring to FIG. 68, remove the oxide 662. This can be done with dilute HF. Referring to FIG. 69, wet etch the exposed areas. This can be done with KOH since the mask is made of nitride. Optionally, the nitride material is removed with etchant that does not damage the silicon, as shown in FIG. 70.

Figure 71:
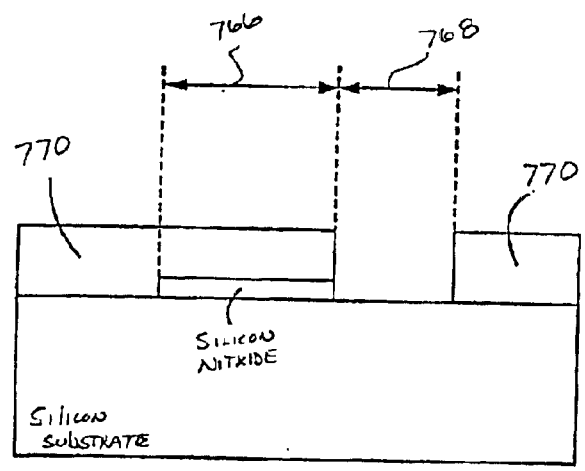
FIG. 71 is a cross-sectional view of a substrate according to a third method.
Figure 72:
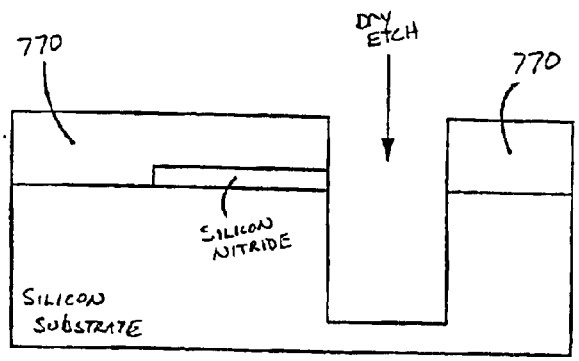
FIG. 72 is a cross-sectional view of a substrate according to a third method.
Figure 73:
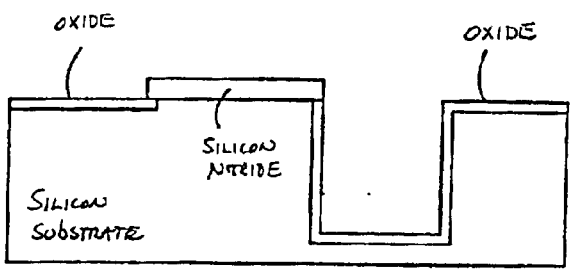
FIG. 73 is a cross-sectional view of a substrate according to a third method.
Figure 74:
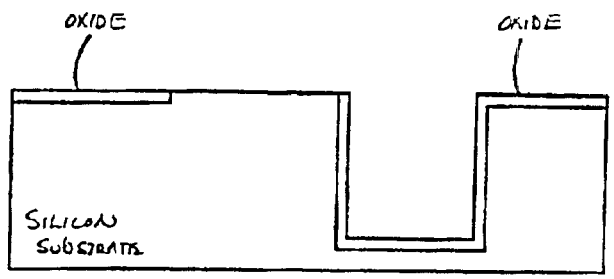
FIG. 74 is a cross-sectional view of a substrate according to a third method.
Figure 75:
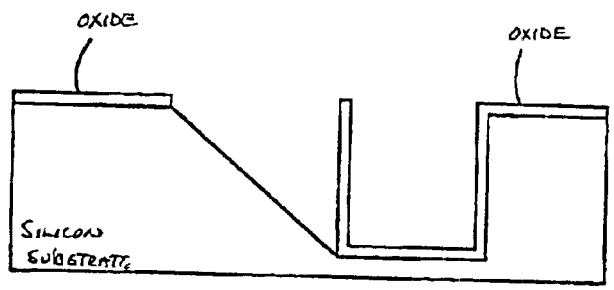
FIG. 75 is a cross-sectional view of a substrate according to a third method.

Referring to FIGS. 71–75, a third method for making the structures of the present invention is described. Referring to FIG. 71, deposit and pattern a hard mask material that blocks oxide formation (e.g. silicon bitride), and then deposit and pattern photoresist 770. The dry etch area 768 and the wet etch area 766 are defined as shown. The photoresist 770 does not need to cover the entire hard mask area. Referring to FIG. 72, dry etch the area exposed by the photoresist 770 and the hard mask. Referring to FIG. 73, remove the photoresist 770 and oxidize. Oxide will not grow under the hard mask. Remove the hard mask, as shown in FIG. 74, and wet etch with anisotropic etchant, as shown in FIG. 75. The oxide can be removed after step (5) in FIG. 75.

It will be clear to one skilled in the art that the above embodiment may be altered in many ways without departing from the scope of the invention. Accordingly, the scope of the invention should be determined by the following claims and their legal equivalents.

What is claimed is:

1. An optical submount comprising:
   a) a crystalline substrate;
   b) an anisotropically etched groove in the substrate; and
   c) a dry pit intersecting the groove at one end of the groove, wherein the dry pit intersects a wedge area of the groove and wherein the dry pit has a triangular shape aligned symmetrically with the groove.

2. The optical submount of claim 1 wherein the dry pit is deeper than the groove.

3. The optical submount of claim 1 wherein the dry pit covers a wedge area of the groove.

4. The optical submount of claim 1 wherein the dry pit is formed before the groove.

5. The optical submount of claim 1 wherein the dry pit includes an etched area to allow for laser beam expansion.

6. The optical submount of claim 1 wherein the dry pit includes a slot for optical device.

7. The optical submount of claim 1 wherein the crystalline substrate is a <100> silicon substrate.

8. A micromachined crystalline substrate comprising:
   a) an anisotropically etched groove in the substrate; and
   b) a dry pit intersecting the groove at one end of the groove, wherein the dry pit comprises an apex that intersects a wedge area of the groove.

9. The substrate of claim 8 wherein the dry pit is formed before the groove.

10. The substrate of claim 8 wherein the dry pit covers a wedge area of the groove.

11. The substrate of claim 8 wherein the dry pit is deeper than the groove.

12. The substrate of claim 8 further comprising a wet pit disposed adjacent to the dry pit and opposite the groove.

13. The substrate of claim 8 wherein the crystalline substrate is a <100> silicon substrate.

14. A micromachined crystalline substrate comprising:
   a) a first anisotropically etched groove in the substrate;
   b) a second anisotropically etched groove in the substrate, parallel with the first groove; and
   c) a dry pit disposed between the first groove and second groove, wherein the dry pit comprises an apex that intersects a wedge area of the first groove and a wedge area of the second groove.

15. The substrate of claim 14 wherein the dry pit is formed before the grooves.

16. The substrate of claim 14 wherein the dry pit covers a wedge area of each groove.

17. The substrate of claim 14 wherein the dry pit is deeper than the first groove and second groove.

18. The substrate of claim 14 wherein the first groove and second groove are in-line.

19. The substrate of claim 14 wherein the crystalline substrate is a <100> silicon substrate.

20. A micromachined crystalline substrate comprising:
   a) an anisotropically etched groove in the substrate; and
   b) a dry pit intersecting the groove at one end of the groove, wherein the dry pit intersects the groove at an angles of 45 degree or less, so that a wedge is not present in the groove adjacent to the dry pit.

21. The substrate of claim 20 wherein the dry pit is formed before the groove.

22. The substrate of claim 20 wherein the dry pit is deeper than the groove.

23. The substrate of claim 20 wherein the crystalline substrate is a <100> silicon substrate.

24. A micromachined crystalline substrate comprising:
   a) a first anisotropically etched groove in the substrate;
   b) a second anisotropically etched groove in the substrate, perpendicular with the first groove and joined with the first groove; and
   c) a dry pit disposed at a convex corner location where the first and second grooves meet.

25. The substrate of claim 24 wherein the dry pit is formed before the grooves.

26. The substrate of claim 24 wherein the dry pit is deeper than the first groove and second groove.

27. The substrate of claim 24 wherein the dry pit covers a convex corner location defined by the first and second grooves.

28. The substrate of claim 24 wherein the crystalline substrate is a <100> silicon substrate.

29. A micromachined crystalline substrate comprising:
   a) an anisotropically etched wet pit in the substrate;
   b) a U-shaped dry pit intersecting the wet pit; and
   c) a U-area inside the U-shaped dry pit, wherein the U-shaped dry pit is disposed so that the U-area is not part of the wet pit.

30. The substrate of claim 29 wherein the dry pit is formed before the wet pit.

31. The substrate of claim 29 wherein the dry pit is deeper than the wet pit.

32. The substrate of claim 29 wherein the wet pit is deeper than the dry pit.

33. The substrate of claim 29 further comprising a laser disposed on the U-area, and a ball lens disposed in the wet pit.

34. The substrate of claim 29 wherein the crystalline substrate is a <100> silicon substrate.

35. The optical submount of claim 1 wherein the dry pit has a triangular cross-sectional shape within a plane parallel to the plane of the substrate.

36. The substrate of claim 8 wherein the dry pit comprises a triangular shape.

37. The substrate of claim 8 wherein the dry pit has a triangular cross-sectional shape in a plane parallel to the plane of the substrate.

38. The substrate of claim 8 wherein the dry pit has a diamond cross-sectional shape within a plane parallel to the plane of the substrate.

39. The substrate of claim 14 wherein the dry pit comprises a triangular shape.

40. The substrate of claim 14 wherein the dry pit has a triangular cross-sectional shape within a plane parallel to the plane of the substrate.

41. The substrate of claim 14 wherein the dry pit has a diamond cross-sectional shape in a plane parallel to the plane of the substrate.

* * * * *